(12) United States Patent
Lee et al.

(10) Patent No.: US 7,534,707 B2
(45) Date of Patent: May 19, 2009

(54) MOS TRANSISTORS HAVING INVERTED T-SHAPED GATE ELECTRODES AND FABRICATION METHODS THEREOF

(75) Inventors: Shin-Ae Lee, Gyeonggi-do (KR); Dong-gun Park, Gyeonggi-do (KR); Chang-sub Lee, Gyeonggi-do (KR); Jeong-dong Choe, Gyeonggi-do (KR); Sung-min Kim, Incheon Metropolitan (KR); Seong-ho Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/560,556

(22) Filed: Nov. 16, 2006

(65) Prior Publication Data
US 2007/0096217 A1 May 3, 2007

Related U.S. Application Data

(62) Division of application No. 10/683,782, filed on Oct. 10, 2003, now Pat. No. 7,154,154.

(30) Foreign Application Priority Data
Oct. 11, 2002 (KR) .............................. 2002-62009

(51) Int. Cl.
*H01L 21/3205* (2006.01)
(52) U.S. Cl. ...................................... 438/585; 438/305
(58) Field of Classification Search .................. 438/182, 438/585, 305
See application file for complete search history.

(56) References Cited

U.S. PATENT DOCUMENTS

| 4,818,715 A | 4/1989 | Chao |
| 5,162,884 A | 11/1992 | Liou et al. |
| 5,468,665 A | 11/1995 | Lee et al. |
| 5,837,588 A | 11/1998 | Wu |

(Continued)

FOREIGN PATENT DOCUMENTS

KR 1020010004039 A 1/2001

OTHER PUBLICATIONS

Notice to Submit Response, Korean Application No. 10-2002-0062009, Jan. 12, 2005.

*Primary Examiner*—Jack Chen
(74) *Attorney, Agent, or Firm*—Myers Bigel Sibley & Sajovec

(57) ABSTRACT

MOS transistors have an active region defined in a portion of a semiconductor substrate, a gate electrode on the active region, and drain and source regions in the substrate. First and second lateral protrusions extend from the lower portions of respective sidewalls of the gate electrode. The drain region has a first lightly-doped drain region under the first lateral protrusion, a second lightly-doped drain region adjacent the first lightly-doped drain region, and a heavily-doped drain region adjacent to the second lightly-doped drain region. The source region similarly has a first lightly-doped source region under the second lateral protrusion, a second lightly-doped source region adjacent the first lightly-doped source region, and a heavily-doped source region adjacent to the second lightly-doped source region. The second lightly-doped regions are deeper than the first lightly-doped regions, and the gate electrode may have an inverted T-shape.

25 Claims, 23 Drawing Sheets

U.S. PATENT DOCUMENTS

| | | | |
|---|---|---|---|
| 6,008,100 A * | 12/1999 | Yeh et al. | 438/305 |
| 6,130,135 A | 10/2000 | Wu | 438/305 |
| 6,245,619 B1 | 6/2001 | Boyd et al. | |
| 6,436,776 B2 | 8/2002 | Nakayama et al. | |

* cited by examiner

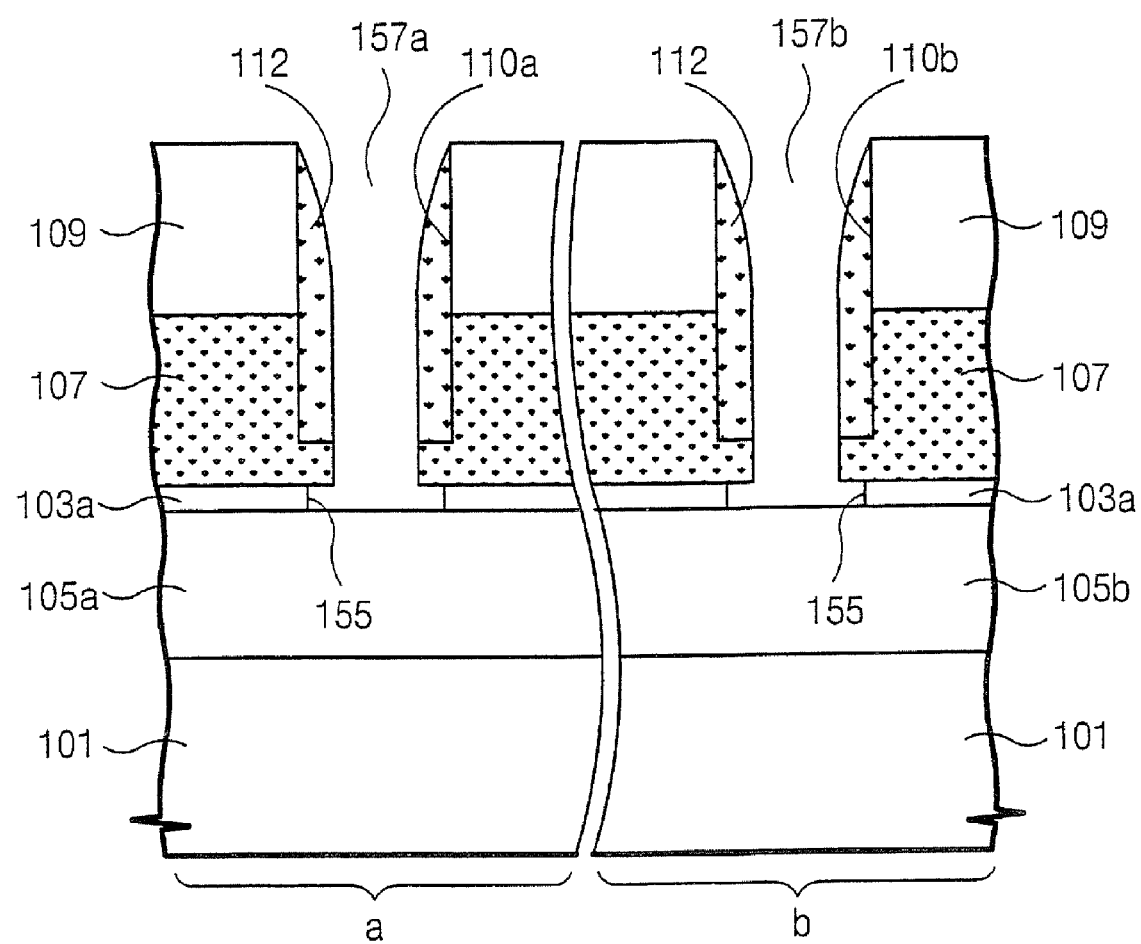

MOS TRANSISTORS HAVING INVERTED T-SHAPED GATE ELECTRODES AND FABRICATION METHODS THEREOF

REFERENCE TO PRIORITY APPLICATION

This application is a divisional of U.S. application Ser. No. 10/683,782, filed Oct. 10, 2003, now U.S. Pat. No. 7,154,154 which claims priority to Korean Application No. 2002-62009, filed Oct. 11, 2002. The disclosure of each of the above-referenced applications are hereby incorporated herein by reference.

FIELD OF THE INVENTION

The present invention relates to semiconductor devices, and, more specifically, to metal oxide semiconductor (MOS) transistors and fabrication methods thereof.

BACKGROUND OF THE INVENTION

MOS devices refer to integrated circuits that include numerous MOS transistors. One way of increasing the integration of MOS devices is to decrease the size of the MOS transistors. Various methods for decreasing the size of MOS transistors have been proposed, such as the method for fabricating a short channel MOS transistor disclosed in, U.S. Pat. No. 6,245,619 B1. FIGS. 1, 2, and 3A are cross-sectional views illustrating the method for fabricating MOS transistors that is disclosed in U.S. Pat. No. 6,245,619.

Referring to FIG. 1, a pad oxide layer 3 and a pad nitride layer 5 are formed sequentially on a semiconductor substrate 1. The pad oxide layer 3 has a thickness of 80 Å to 200 Å. The pad. nitride layer 5 and the pad oxide layer 3 are patterned, and then a gate hole 7 is formed to expose a portion of the semiconductor substrate 1.

Referring to FIG. 2, a gate oxide layer 9 is formed on the exposed portion of the semiconductor substrate 1. The gate oxide layer 9 has a thickness of 30 Å or less. A polysilicon gate 11 is formed in the gate hole 7 on the gate oxide layer 9.

As shown in FIG. 3A, the pad nitride layer 5 is then removed. Next, a thermal oxide layer 13 is formed on the surface of the polysilicon gate 11. a dielectric layer is formed on the semiconductor substrate 1 and on the thermal oxide layer 13. The dielectric layer is etched in an isotropic manner to form spacers 15 on the sidewalls of the polysilicon gate 11. Then, dopants are implanted in the semiconductor substrate 1 using the polysilicon gate 11 and the spacers 15 as an implant mask to form heavily-doped source/drain regions 17. Next, the spacers 15 are selectively removed and the semiconductor substrate 1 is implanted with impurity ions using the polysilicon gate 11 as an implant mask to form lightly-doped source/drain regions 19 on the surface of the semiconductor substrate 1 adjacent to the sidewalls of the polysilicon gate 11.

The length L of the lightly-doped source/drain regions 19 depends on the width W of the spacers 15. Thus, to decrease the length L of the lightly-doped source/drain regions 19 it may be necessary to decrease the width W of the spacers 15. However, the spacers 15 may also be used in the salicide (self-aligned silicide) process. In the salicide process, it may be necessary to increase the width W of the spacer 15 to prevent a bridge between the gate electrode and the source/drain regions. If this occurs, the on-current of the MOS transistor may decrease because the electrical resistance of the lightly-doped source/drain regions 19 increases. A MOS transistor fabricated by the salicide process is disclosed in FIG. 3B.

In the device shown in FIG. 3B, prior to forming the spacers 15, the semiconductor substrate 1 is implanted with impurity ions using the polysilicon gate 11 as an implant mask. The lightly-doped source/drain regions 19 are formed in the semiconductor substrate 1 at both sides of the polysilicon gate 11. Next, the spacers 15 are formed on the sidewalls of the gate 11. The semiconductor substrate 1 is implanted with impurity ions using the gate 11 and the spacers 15 as an implant mask to form the highly-doped source/drain regions 17. Metal silicide layers 21a and 21b are formed selectively on the upper portions of the gate 11 and the highly-doped source/drain regions 17 by a conventional salicide process. The lightly-doped source/drain regions 19 should be formed at a shallow depth to improve the short channel effect of the MOS transistor and, to reduce the leakage current between the metal silicide layer 21b and the semiconductor substrate 1.

FIGS. 4-7 are cross-sectional views illustrating a method for fabricating another prior art device. In FIGS. 4-7, the reference sign "a" indicates an NMOS transistor region and the reference "b" indicates a PMOS transistor region.

As shown in FIG. 4, a pad oxide layer 33 and a pad nitride layer 35 are formed sequentially on a semiconductor substrate 31. The pad nitride layer 35 and the pad oxide layer 33 are patterned to form a first gate pattern groove 37n on the NMOS transistor region (a) and a second gate pattern groove 37p on the PMOS transistor region (b). The first gate pattern groove 37n and the second gate pattern groove 37p each expose a portion of the semiconductor substrate 31.

Referring to FIG. 5, a gate oxide layer 39 is formed on the exposed surfaces of the semiconductor substrate 31. An undoped polysilicon layer is formed on the gate oxide layer 39. The undoped polysilicon layer is planarized until the upper part of the pad nitride layer 35 is exposed so as to form a first undoped gate pattern 41n in the first gate pattern groove 37n and a second undoped gate pattern 41p in the second gate pattern groove 37p. Next, a photoresist pattern 43 is formed on the PMOS transistor region (b). The first undoped gate pattern 41n is implanted with n-type impurity ions using ion implantation with a high dosage of around $5 \times 10^{15}$ atoms/cm$^2$ and an energy of 15 KeV using the photoresist pattern 43 as an implant mask. It is preferable to employ highly diffusive phosphorous ions as the n-type impurity ions to achieve homogenous doping of the first undoped gate pattern 41n. In this case, the maximum distribution of the impurity ions is at a projection range "Rp" which is about 200 Å below the upper surface of the first undoped gate pattern 41n. The phosphorous ions are distributed from the surface of the first undoped gate pattern 41n to about 500 Å below the top surface of the first undoped gate pattern 41n. The portion of the gate pattern 41n doped with phosphorous ions may be damaged by the ion implantation and changed from a polycrystalline state to an amorphous state.

As shown in FIG. 6, the photoresist pattern 43 is then removed. Next, the pad nitride layer 35 is removed to expose the sidewalls of the first gate pattern 41n and the second gate pattern 41p. The pad nitride layer 35 may be removed using a solution of phosphoric acid. The damaged part (or amorphous silicon region) of the first gate pattern 41n may also be easily removed to form a first deformed gate pattern. The first deformed gate pattern comprises an undoped polysilicon layer. This shows that it is difficult to dope the first gate pattern 41n with the phosphorous ions. The height of the second gate pattern 41p may remain unchanged.

Next, an n-type lightly-doped region 45 is formed in the semiconductor substrate 31 adjacent the sidewalls of the first deformed gate pattern and a p-type lightly-doped region 47 is formed in the semiconductor substrate 31 adjacent the sidewalls of the second gate pattern 41p. These lightly doped regions may be formed using conventional methods. Then, a first spacer 49n is formed on the sidewalls of the first deformed gate pattern and a second spacer 49p is formed on the sidewalls of the second gate pattern 41p. Ion implantations is then used to implant the semiconductor substrate in the NMOS transistor region (a) with a high dose of arsenic ions (e.g., $1 \times 10^{15} - 5 \times 10^{15}$ atoms/cm$^2$), using the first deformed gate pattern and the first spacer 49n as an implant mask, to form a highly-doped n-type region 51.

The diffusivity of phosphorous ions is lower than that of arsenic ions. As a result, arsenic ions are used extensively to form shallow source/drain regions in NMOS transistors that have a short channel. In the example of FIGS. 4-7, the arsenic ions are also doped into the first deformed gate pattern to form an n-type gate electrode 41n' in the NMOS transistor region (a). However, it may be difficult to homogenously dope the first deformed gate pattern with the arsenic ions because the lower diffusivity of the arsenic ions makes it difficult to fully diffuse the arsenic ions to the lower part of the first deformed gate pattern. As a result, the semiconductor substrate doped with arsenic ions typically is annealed at a high temperature for a long time or the height of the first undoped gate pattern 41n and the second gate pattern 41p is reduced in an effort to form a homogenous doping profile for the n-type gate electrode 41n'. However, the long-time, high-temperature annealing process also acts to increase the depth of the n-type heavily-doped regions 51 such that the short channel characteristic of the NMOS transistor may deteriorate.

Also, when the second undoped gate pattern 41p is formed thinly, it may cause problems in the formation of the PMOS transistor. Specifically, the semiconductor substrate may be implanted with boron ions (e.g., at a dose of $1 \times 10^{15} - 5 \times 10^{15}$ atoms/cm$^2$) using the second undoped gate pattern 41p and the second spacer 49p as an implant mask to form a p-type heavily-doped region 53. The second undoped gate pattern 41p is also implanted with the boron ions during this process to form a p-type gate electrode 41p'. Unlike the phosphorous and arsenic ions, the boron ions can penetrate the interface between the second undoped gate pattern 41p and the gate oxide layer 39 and diffuse into the semiconductor substrate 31. Accordingly, when the thickness of the second undoped gate pattern 41p is thin, it may result in variation of the channel under the p-type gate electrode 41p'. This may cause instability in the threshold voltage characteristic of the PMOS transistor.

Referring to FIG. 7, a metal silicide layer 55 is selectively formed on the n-type gate electrode 41n', the p-type gate electrode 41p', the n-type heavily-doped region 51, and the p-type heavily-doped region 53 by a conventional salicide (self-aligned silicide) process followed by an annealing treatment. In the annealing process, impurity ions in the n-type gate electrode 41n' may be depleted severely by a dopant segregation effect at the interface between the n-type gate electrode 41n' and the metal silicide layer 55 because the n-type gate electrode 41n' is thinner than the p-type gate electrode 41p'. Consequently, an impurity depletion region 57 may be generated in the n-type gate electrode 41n', making the threshold voltage characteristic of the NMOS transistor unstable. The threshold voltage characteristic of the NMOS transistor may be degraded remarkably if the impurity depletion region 57 is formed adjacent to the gate oxide layer 39.

SUMMARY OF THE INVENTION

Pursuant to embodiments of the present invention, MOS transistors are provided that have an active region defined in a portion of a semiconductor substrate, a gate electrode on the active region, and drain and source regions in the substrate. First and second lateral protrusions extend from the lower portions of respective sidewalls of the gate electrode. The drain region has a first lightly-doped drain region under the first lateral protrusion, a second lightly-doped drain region adjacent the first lightly-doped drain region, and a heavily-doped drain region adjacent to the second lightly-doped drain region. The source region similarly has a first lightly-doped source region under the second lateral protrusion, a second lightly-doped source region adjacent the first lightly-doped source region, and a heavily-doped source region adjacent to the second lightly-doped source region. The second lightly-doped regions are deeper than the first lightly-doped regions, and the gate electrode may have an inverted T-shape.

The MOS transistor may further include an insulating gate spacer that covers the sidewalls of the gate electrode. The second lightly-doped drain region and the second lightly-doped source region may be disposed under bottom portions of this insulating gate spacer, and the heavily doped drain and source regions may be adjacent the outer sidewalls of the insulating gate spacer.

The MOS transistor may also include a gate dielectric layer interposed between the gate electrode and the active region. A curing thermal oxide layer may also be provided on the sidewalls of the gate electrode and on the second lightly-doped drain and source regions. An insulating gate spacer may be provided on the curing thermal oxide layer, and a spacer etch stop layer may be interposed between the insulating gate spacer and the curing thermal oxide layer.

In embodiments of the present invention, the sidewalls of the first and second lateral protrusions may be vertically profiled. Alternatively, the sidewalls of the first and second lateral protrusions may be sloped at positive angles and/or at negative angles. The MOS transistor may also include a metal silicide layer on the upper surface of the gate electrode and on the surfaces of the heavily-doped drain and source regions.

Pursuant to further embodiments of the present invention, CMOS transistors are provided that comprise a semiconductor substrate having an NMOS transistor region that includes an inverted T-shaped n-type gate electrode and a PMOS transistor region that includes an inverted T-shaped p-type gate electrode. A first gate spacer may be provided on the sidewalls of the n-type gate electrode and a second gate spacer may be provided on the sidewalls of the p-type gate electrode.

In these transistors, a pair of first n-type lightly-doped regions are provided in the substrate under portions of the n-type gate electrode. A pair of second n-type lightly-doped regions may also be provided in the substrate under respective portions of the first gate spacer, where the second n-type lightly-doped regions are deeper than the first n-type lightly-doped regions. An n-type heavily-doped region is further provided in the substrate adjacent to each of the second n-type lightly-doped regions. A pair of p-type heavily-doped regions are provided in the substrate adjacent the p-type gate electrode.

The CMOS transistor may also include a gate dielectric layer interposed between the n-type gate electrode and the substrate and between the p-type gate electrode and the substrate. The sidewalls of the crossbar portion of the inverted T-shaped gate electrodes may be vertically profiled and/or may be sloped at positive or negative angles. The transistor may further include an n-type pocket impurity region covering at least the sidewalls of the p-type heavily-doped regions where the n-type pocket impurity region extends to the second active region under the p-type gate electrode.

Pursuant to further embodiments of the present invention, methods of fabricating a MOS transistor are provided. Pursuant to these embodiments of the present invention, an active region may be defined in a semiconductor substrate and a gate electrode may be formed on the active region that has first and second lateral protrusions extending from a lower portion thereof. A drain region is formed in the substrate that comprises a first lightly-doped drain region that is located under the first lateral protrusion, a second lightly-doped drain region that is deeper than, and located adjacent to, the first lightly-doped drain region, and a heavily-doped drain region that is located adjacent to the second lightly-doped drain region. A source region is likewise formed in the substrate that comprises a first lightly-doped source region under the second lateral protrusion, a second lightly-doped source region that is deeper than, and located adjacent to, the first lightly-doped source region, and a heavily-doped source region adjacent to the second lightly-doped source region.

The gate electrode may be formed on the active region by forming a buffer layer on the surface of the substrate and a molding layer on the buffer layer. Then, a groove may be formed that penetrates both the molding layer and the buffer layer to expose the active region. The width of the groove in the buffer layer is greater than the width of the groove in the molding layer such that a pair of undercut regions are formed in the buffer layer. A gate dielectric layer may be provided on the exposed portion of the active region. Then, an inverted T-shaped gate pattern may be formed in the groove.

After the inverted T-shaped gate pattern is formed the molding layer and the buffer layer may be removed and impurity ions may be implanted into the active region using the inverted T-shaped gate pattern as an implant mask so as to simultaneously form the first lightly-doped drain region, the first lightly-doped source region, the second lightly-doped drain region and the second lightly-doped source region. Thereafter, a gate spacer may be formed on the sidewalls of the inverted T-shaped gate pattern and impurity ions may be implanted into the active region using the gate pattern and the gate spacer as an implant mask so as to form a heavily-doped drain region in the active region adjacent to one of the outer sidewalls of the gate spacer and a heavily-doped source region in the active region adjacent to the other one of the outer sidewalls of the gate spacer.

The groove may be formed by patterning the molding layer to expose a portion of the buffer layer and then etching the exposed portion of the buffer layer in an isotropic manner so as to form the pair of undercut regions. The undercut regions may have vertically profiled outer sidewalls or outer sidewalls that are sloped at a positive or negative angle. The inverted T-shaped gate pattern may be formed in the groove by forming an undoped semiconductor layer on the substrate that fills the groove and then planarizing this layer until the surface of the molding layer is exposed.

A curing thermal oxide layer may be provided on the substrate prior to forming the gate spacer, and a spacer etch stop layer may be provided on the curing thermal oxide layer. A metal silicide layer may be selectively formed on an exposed upper surface of the gate pattern and on the upper surfaces of the heavily-doped regions.

BRIEF DESCRIPTION OF THE DRAWINGS

FIGS. 21A, 21B, 21C, and 22-24 are cross-sectional views illustrating steps of methods according to embodiments of the present invention for fabricating the MOS transistor of FIG. 9.

DETAILED DESCRIPTION

Figure 1:
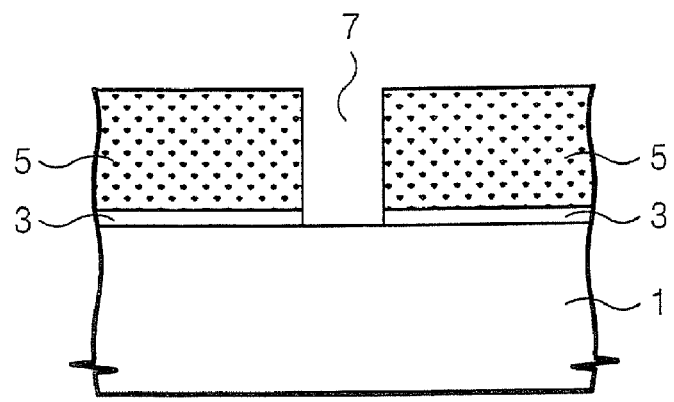
FIGS. 1, 2, 3A, 3B, 4, 5, 6 and 7 are cross-sectional views illustrating prior art methods for fabricating MOS transistors.
Figure 2:
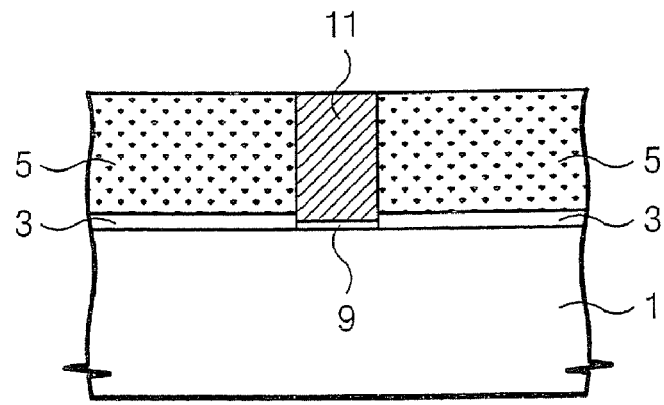
Figure 3A:
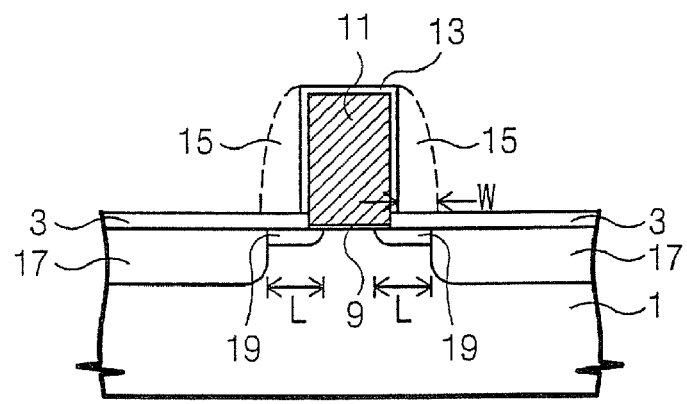
Figure 3B:
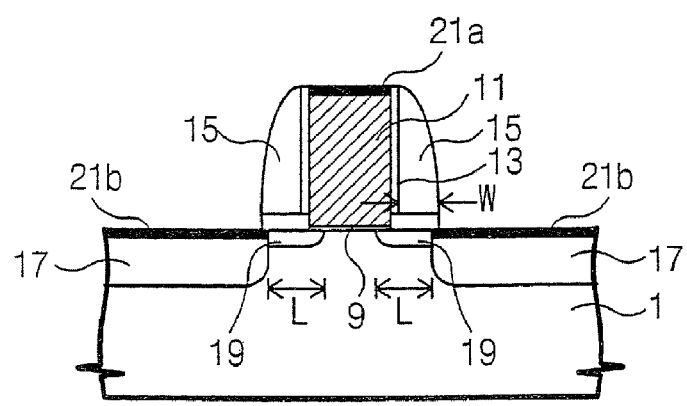
Figure 4:
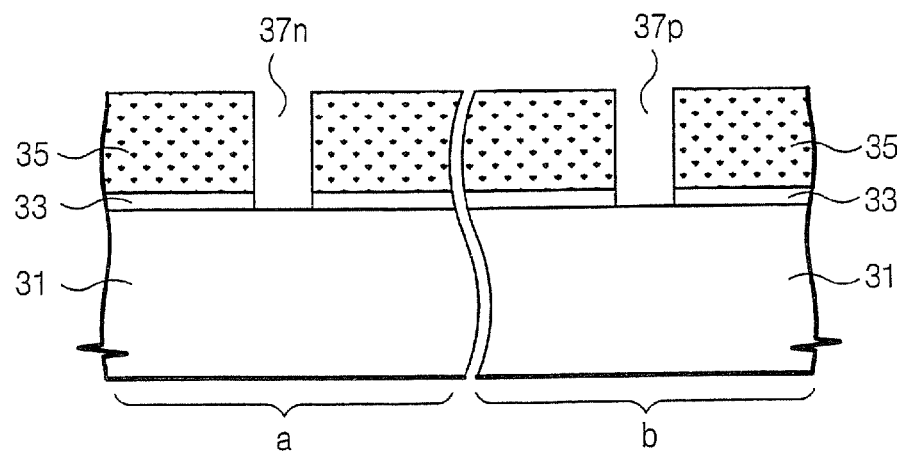
Figure 5:
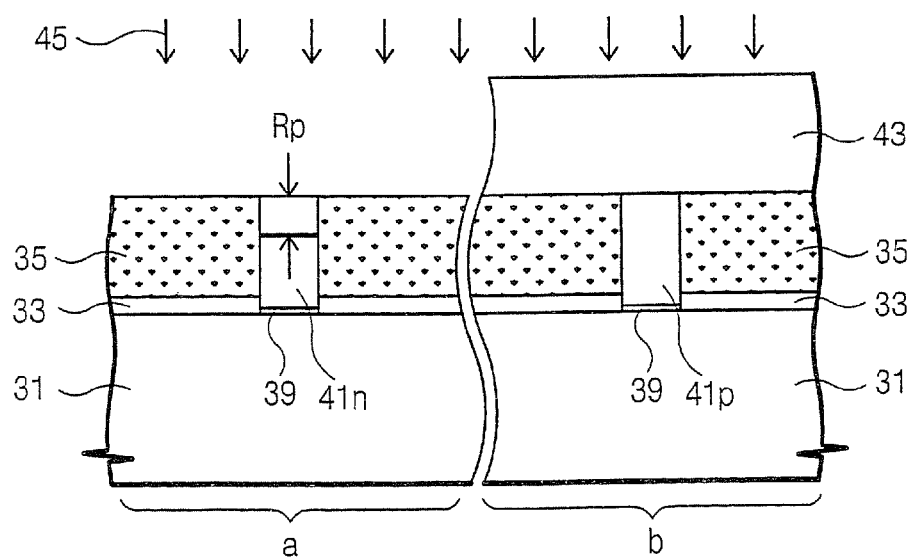
Figure 6:
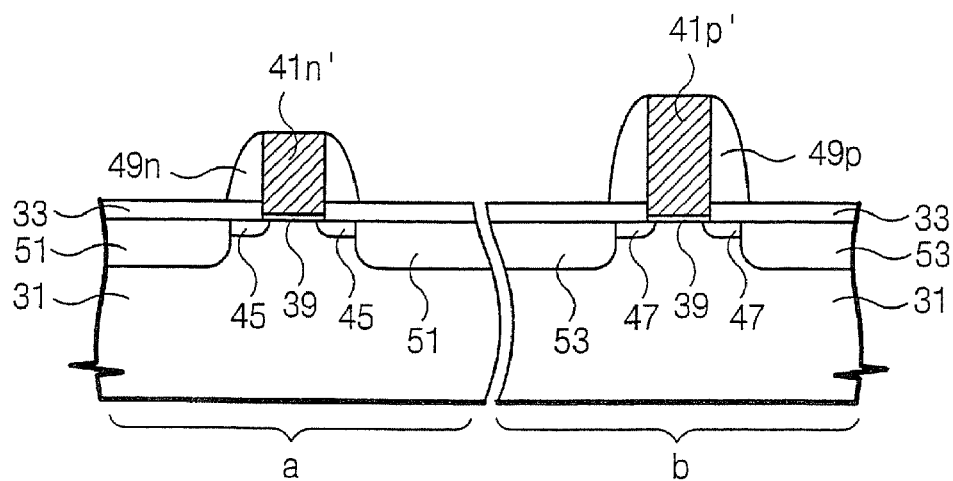
Figure 7:
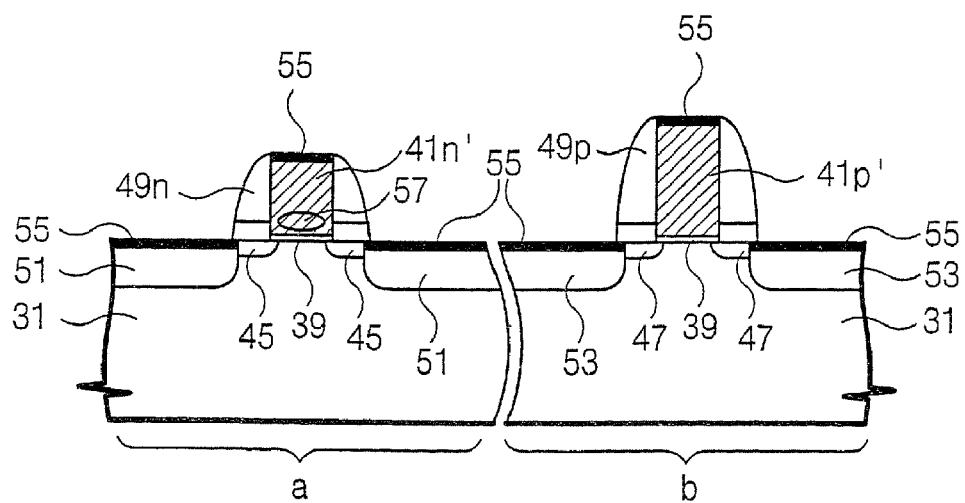

The present invention will now be described more fully with reference to the accompanying drawings, in which typical embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer or element is referred to as being "on" another layer or substrate, it can be directly on the other layer, element or substrate, or intervening layers and/or elements may also be present. In contrast, when a layer/element is referred to as being "directly on" another layer/element, there are no intervening layers or elements present. Likewise, when an element is described as being "between " two other elements it may be the only element between the two other elements or additional elements may also be present. When a layer or element is referred to as being under another layer or element, it can be directly under the other layer or element or intervening layers or elements may also be present. Like reference numerals refer to like elements throughout.

Figure 8:
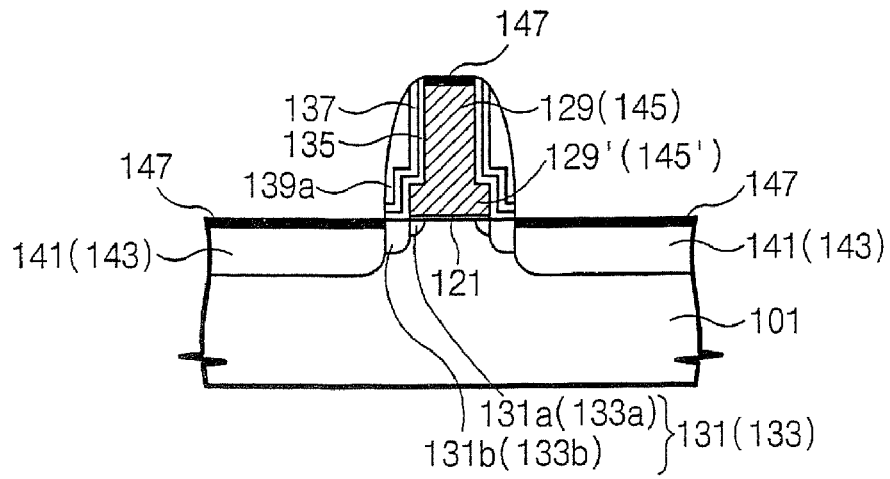
FIG. 8 is a cross-sectional view illustrating a MOS transistor according to first embodiments of the present invention.

FIG. 8 is a sectional view illustrating a MOS transistor according to first embodiments of the present invention. An active region is defined in a portion of a semiconductor substrate 101. The semiconductor substrate 101 may be a p-type silicon substrate or an n-type silicon substrate. The active region may be defined by isolation layers (not shown). A gate electrode 129 (or 145) is located on the active region. The gate electrode 129 is n-type and the gate electrode 145 is p-type. The gate electrode 129 (or 145) has a pair of protrusions 129' (or protrusions 145' if the device has a p-type gate electrode) extending in the horizontal direction from the lower part of the gate electrode 129 (or 145) to give the gate electrode 129 (or 145) an inverted T-shape. As shown in FIG. 8, the protrusions 129' (or 145') may have vertical profiled sidewalls. A gate dielectric layer 121 may be interposed between the gate electrode 129 (or 145) and the semiconductor substrate 101. A pair of gate spacers 139a cover the sidewalls of the gate electrode 129 (or 145), including the sidewalls of the protrusions 129' (or 145').

As shown in FIG. 8, a first lightly-doped region 131a (or 133a) is located in the substrate 101 under each of the protrusions 129' (or 145') and a second lightly-doped region 131b (or 133b) is provided in the substrate 101 under each of the gate spacers 139a. The reference numerals 131a and 131b refer to devices having n-type impurity ions doped into the region, and the reference numerals 133a and 133b refer to devices having p-type impurity ions doped into the region. The second lightly-doped regions 131*b* (or 133*b*) are deeper than the first lightly-doped regions 131*a* (or 133*a*).

Additionally, a pair of highly-doped regions 141 (or 143) are provided in the semiconductor substrate 101 adjacent to the outer sidewall of each of the gate spacers 139*a*. (The reference numeral 141 refers to a region doped with n-type impurity ions and the reference numeral 143 refers to a region doped with p-type impurity ions.) Thus, each of the second lightly-doped regions 131*b* (or 133*b*) is located between one of the first lightly-doped regions 131*a* (or 133*a*) and one of the highly-doped regions 141 (or 143). The doping impurity concentration of the highly-doped regions 141 (or 143) is higher than the doping impurity concentration in the first lightly-doped regions and the second lightly-doped regions. The lightly-doped ("LDD") region 131 (or 133) consists of the two first lightly-doped regions 131*a* (or 133*a*) and the two second lightly-doped regions 131*b* (or 133*b*). The second lightly-doped regions 131*b* (or 133*b*), which are deeper than the first lightly-doped regions 131*a* (or 133*a*), can provide a reduced electrical resistance of the LDD region 131 (or 133). Meanwhile, the first lightly-doped regions 131*a* (or 133*a*) are adjacent to the channel beneath the gate electrode 129 (or 145) and are shallower than the second lightly-doped regions 131*b* (or 133*b*). As a result, the short channel effect of the MOS transistor may be suppressed extensively.

As is also shown in FIG. 8, a curing thermal oxide layer 135 may cover each of the sidewalls of the gate electrode 129 (or 145) and the surface of the second lightly-doped regions 131*b* (or 133*b*). In the pictured embodiments, the gate spacers 139*a* are located on the curing thermal oxide layer 135. A spacer etch stop layer 137 may also be interposed between the curing thermal oxide layer 135 and the gate spacers 139*a*. The spacer etch stop layer 137 may be formed from a dielectric having etch selectivity with respect to the gate spacers 139*a*. For example, where the gate spacers 139*a* are a layer of silicon oxide, the spacer etch stop layer 137 may be a layer of silicon nitride (or vice versa). Alternatively, where the gate spacers 139*a* are a layer of silicon nitride, the spacer etch stop layer 137 need not be formed.

A metal silicide layer 147 may be located on the upper part of the gate electrode 129 (or 145) and on the surface of the highly-doped regions 141 (or 143). The second lightly-doped regions 131*b* (or 133*b*) which are deeper than the first lightly-doped regions 131*a* (or 133*a*) can help reduce degradation of the leakage current characteristic between the metal silicide layer 147 and semiconductor substrate 101.

If the MOS transistor as shown in FIG. 8 is an NMOS transistor, the semiconductor substrate 101 may be a p-type semiconductor substrate or a p-well. With an NMOS transistor, the gate electrode may comprise an n-type gate electrode 129 and the source/drain regions may be the first n-type lightly-doped regions 131*a*, the second n-type lightly-doped regions 131*b*, and the n-type highly-doped regions 141. If the MOS transistor is a PMOS transistor, the semiconductor substrate 101 may be an n-type semiconductor substrate or an n-well, the gate electrode may comprise a p-type gate electrode 145, and the source/drain regions may comprise the first p-type lightly-doped regions 133*a*, the second p-type lightly-doped regions 133*b*, and the p-type highly-doped regions 143.

Figure 9:
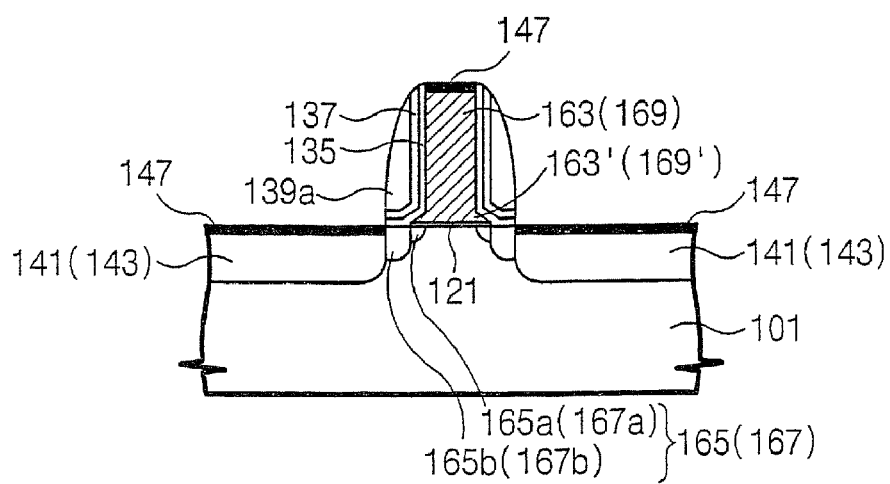
FIG. 9 is a cross-sectional view illustrating a MOS transistor according to second embodiments of the present invention.

FIG. 9 is a sectional view illustrating a MOS transistor according to second embodiments of the present invention. As shown in FIG. 9, an inverted T-shaped gate electrode 163 (or 169) is located on the semiconductor substrate 101 in the same manner as shown in FIG. 8. The gate electrode 163 (or 169) includes a pair of protrusions 163' (or 169') that extend in the horizontal direction from the lower sidewalls of the gate electrode 163 (or 169). In the embodiments of the present invention depicted in FIG. 9, the sidewalls of the protrusions 163' (or 169') can be sloped at a positive angle so that the lower part of each protrusion 163' (or 169') is wider than the upper part of the protrusion.

A first lightly-doped region 165*a* (or 167*a*) is located in the substrate 101 under each of the protrusions 163' (or 169'). In the embodiments of the invention depicted in FIG. 9, the curvature of a first lightly-doped regions 165*a* (or 167*a*) may be larger than the curvature of the first lightly-doped regions 131*a* (or 133*a*) provided in the embodiments of the invention depicted in FIG. 8. This difference in curvature may occur because the first lightly-doped regions 131*a*, 133*a*, 165*a*, or 167*a* are regions that are doped with impurity ions that are diffused through the protrusions 129', 145', 163', or 169'. The hot carrier effect of the MOS transistor depicted in FIG. 9 may be suppressed extensively as compared to the MOS transistor depicted in FIG. 8. A second lightly-doped region 165*b* (or 167*b*) is located adjacent to each of the first lightly-doped regions 165*a* (or 167*a*). The second lightly-doped regions 165*b* may assume the same form as the second lightly-doped regions 131*b* (or 133*b*) discussed above with respect to FIG. 8. An LDD region 165 (or 167) consists of the first lightly-doped regions 165*a* (or 167*a*) and the second lightly-doped regions 165*b* (or 167*b*).

Figure 10:
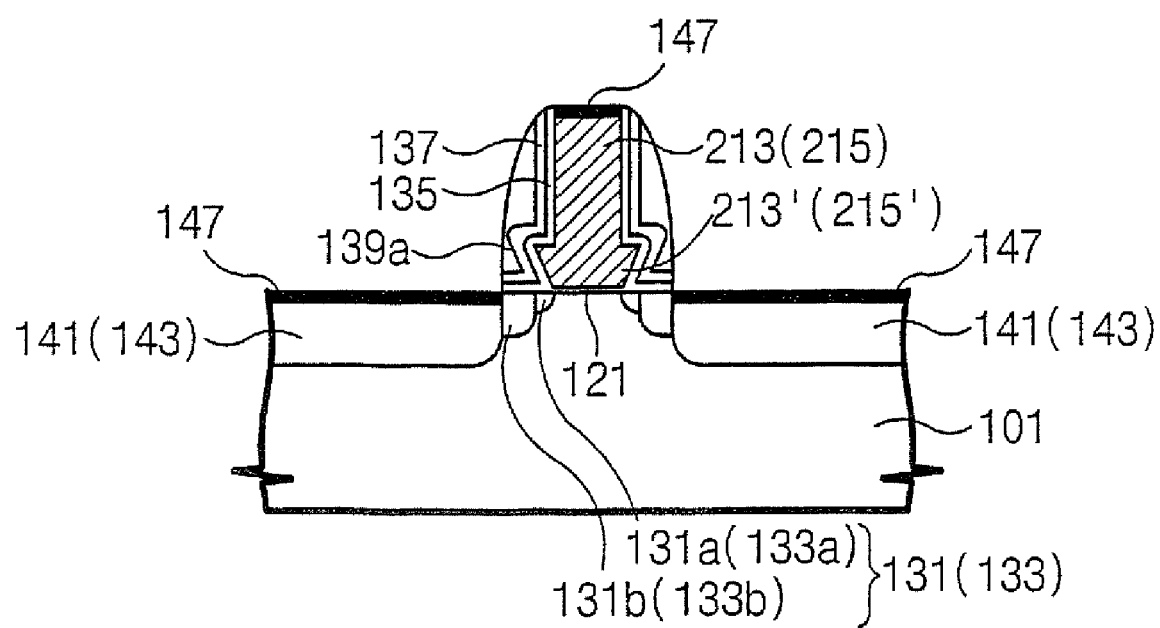
FIG. 10 is a cross-sectional view illustrating a MOS transistor according to third embodiments of the present invention.

FIG. 10 is a sectional view illustrating a MOS transistor according to third embodiments of the present invention. As shown in FIG. 10, an inverted T-shaped gate electrode 213 (or 215) is located on the semiconductor substrate 101. The gate electrode 213 (or 215) includes a pair of protrusions 213' (or 215') that extend in the horizontal or "lateral" direction from the lower sidewalls of the gate electrode 213 (or 215). As shown in FIG. 10, the sidewalls of the protrusions 213' (or 215') are each sloped at a negative angle so that the upper part of each protrusion 213' (or 215') is wider than the lower part of the protrusion. This may advantageously reduce the parasitic capacitance between the LDD region 131 (or 133) and the gate electrode 213 (or 215) as compared to the embodiments of the invention depicted in FIGS. 8 and 9.

FIGS. 11-20 are sectional views illustrating steps of a method for fabricating a CMOS device according to the first embodiments of the present invention. Portions of the drawings labeled "a" indicate an NMOS transistor region while portions of the drawings labeled "b" indicate a PMOS transistor region.

Figure 11:
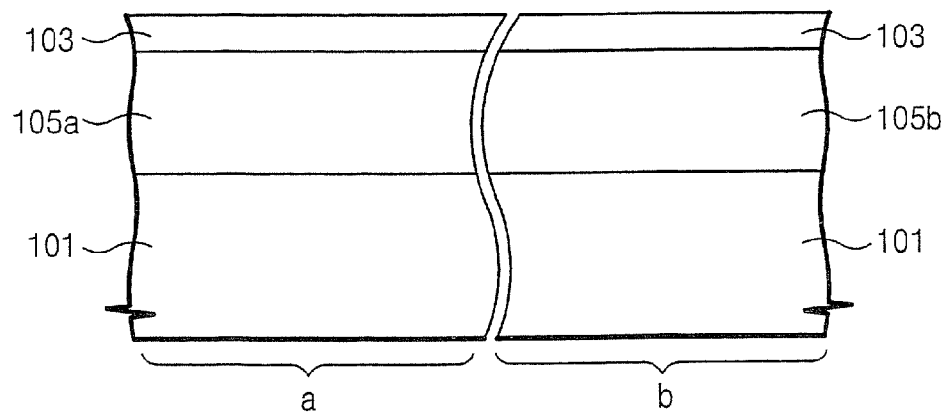
FIGS. 11-20 are cross-sectional views illustrating steps of methods according to embodiments of the present invention for fabricating the MOS transistor of FIG. 8.

As shown in FIG. 11, a semiconductor substrate 101 having an NMOS transistor region (a) and a PMOS transistor region (b) is provided. An isolation layer (not shown) may be formed on a portion of the semiconductor substrate 101 to define a first active region in the NMOS transistor region (a) and a second active region in the PMOS transistor region (b). A p-well 105*a* is formed in the first active region and an n-well 105*b* is formed in the second active region. The first active region and the second active region may be defined after the formation of the p-well 105*a* and the n-well 105*b*. A buffer layer 103 is formed on the semiconductor substrate 101. The buffer layer 103 may be formed from thermal oxide or CVD oxide and may, for example, be 100 Å-300 Å thick.

Figure 12A:
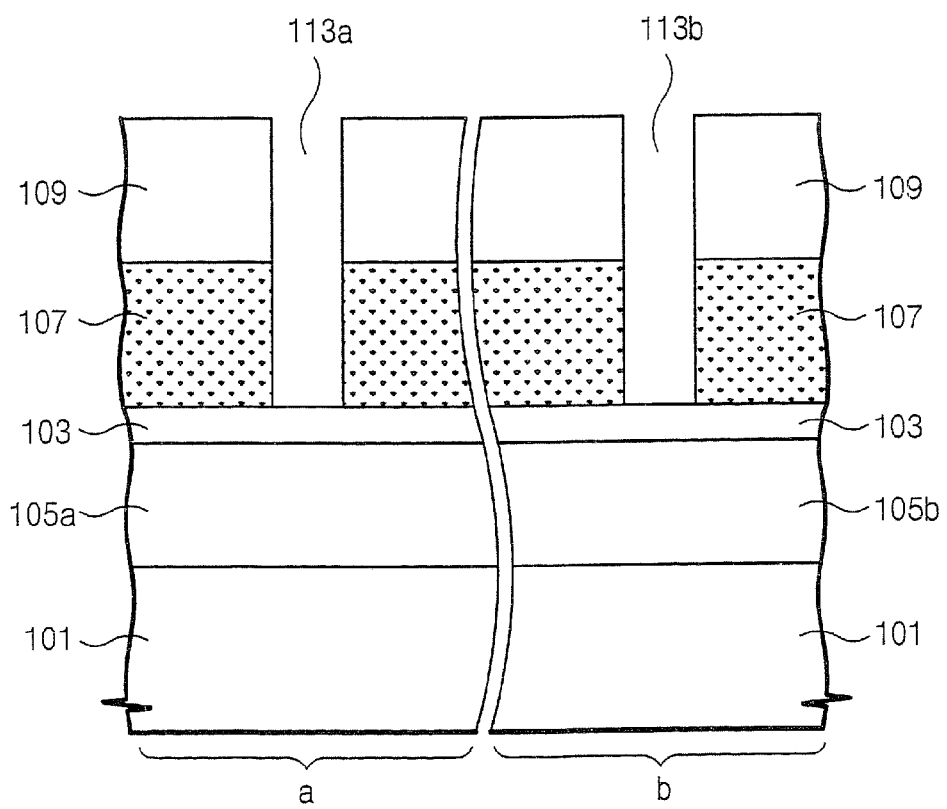

Referring to FIG. 12A, a molding layer 107 and a capping layer 109 are formed successively on the buffer layer 103. The molding layer 107 may be formed from a material having an etch selectivity with respect to the buffer layer 103. The molding layer 107 may be a nitride layer. The capping layer 109 may be formed from material having an etch selectivity with respect to the molding layer 107. For example, the capping layer 109 may be a CVD oxide layer such as an HDP (high density plasma) oxide layer. The capping layer 109 may alternatively be omitted.

The capping layer 109 and the molding layer 107 are patterned successively to form a first preliminary gate pattern groove 113a in the NMOS transistor region (a) and a second preliminary gate pattern groove 113b in the PMOS transistor region (b), each of which expose a portion of the molding layer 107. An anisotropic etching process may be carried out to form the first preliminary gate pattern groove 113a and the second preliminary gate pattern groove 113b. Each one of the preliminary gate pattern grooves 113a and 113b may have a relatively vertical profile in the portion of the groove penetrating the molding layer 107.

Figure 13A:
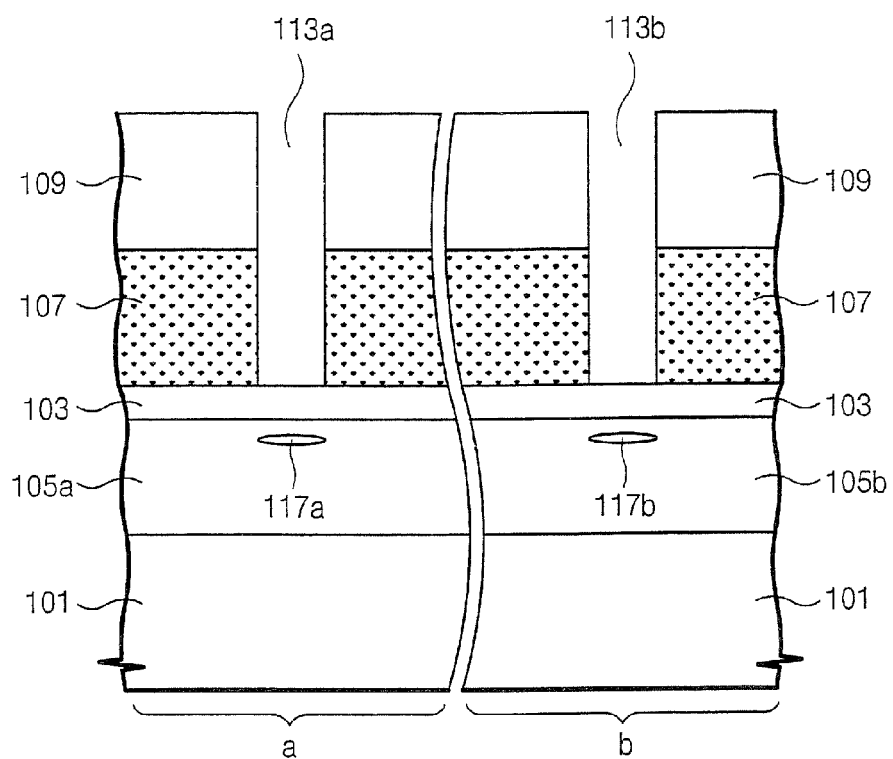

Referring to FIG. 13A, the first preliminary gate pattern groove 113a is implanted with first impurity ions so as to selectively form a first threshold voltage ion implantation region 117a under the buffer layer 103 in the NMOS transistor region (a). The second preliminary gate pattern groove 113b is likewise implanted with second impurity ions so as to selectively form a second threshold voltage ion implantation region 117b under the buffer layer 103 in the PMOS transistor region (b). The conductivity type of the first impurity ions may be the same as or different from the conductivity type of the second impurity ions according to the surface concentration of the p-well 105a and n-well 105b. If the conductivity type of the first impurity ions is identical to the conductivity type of the second impurity ions, the first impurity ions and the second impurity ions may be implanted by means of a single implantation process. The first threshold voltage ion implantation process and the second threshold voltage ion implantation process may be omitted.

Figure 14A:
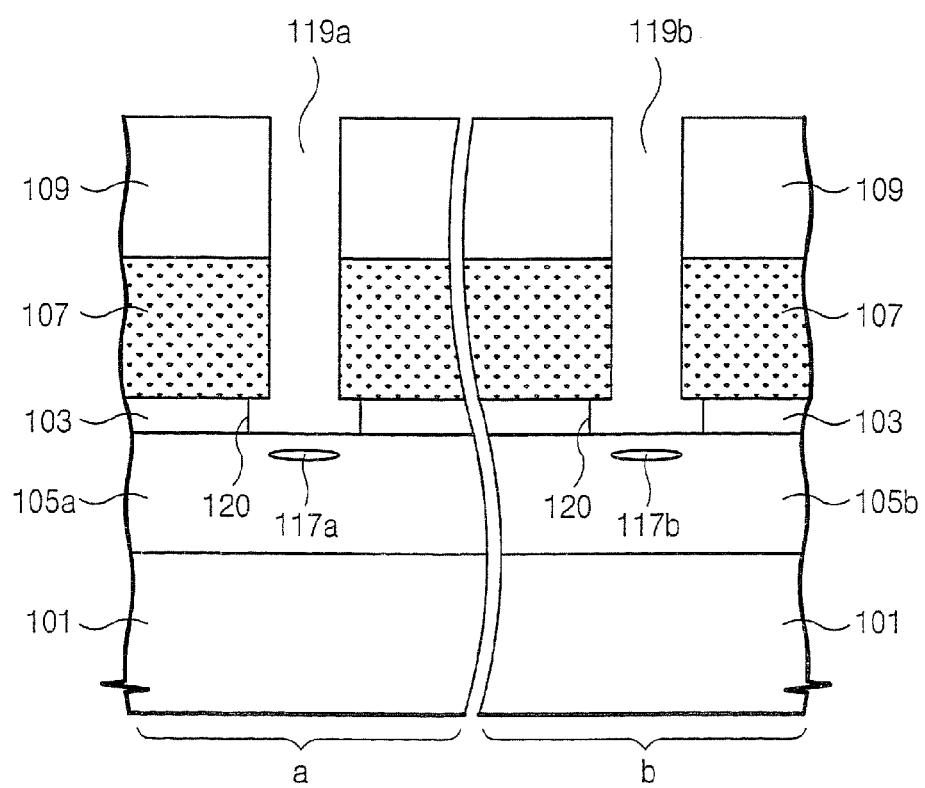

Referring to FIG. 14A, the exposed buffer layer 103 is etched in an isotropic manner so as to form a first gate pattern groove 119a in the NMOS transistor region (a) and a second gate pattern groove 119b in the PMOS transistor region (b). The first gate pattern groove 119a exposes the top surface of the p-well 105a, and the second gate pattern groove 119b exposes the top surface of the n-well 105b. The first gate pattern groove 119a includes an undercut region formed in the buffer layer 103. Likewise, the second gate pattern groove 119b includes an undercut region formed in the buffer layer 103. In the embodiments depicted in FIG. 14A, the sidewalls of the undercut region have a relatively vertical profile. The isotropic etching process may use a wet etchant. For example, where the buffer layer 103 comprises a silicon oxide layer, the isotropic etching process may be performed with HF (hydrofluoric acid) solution or BOE (buffered oxide etchant).

If the first threshold voltage ion implantation process and the second threshold voltage ion implantation process are omitted in step of FIG. 13A, the first threshold voltage ion implantation process and the second threshold voltage ion implantation process may be performed after the isotropic etching process.

FIGS. 12B-14B and FIGS. 12A-14C illustrate two alternative methods for forming the first preliminary gate pattern groove 113a, the second preliminary gate pattern groove 113b, the first gate pattern groove 119a, and the second gate pattern groove 119b according to further embodiments of the present invention.

Figure 12B:
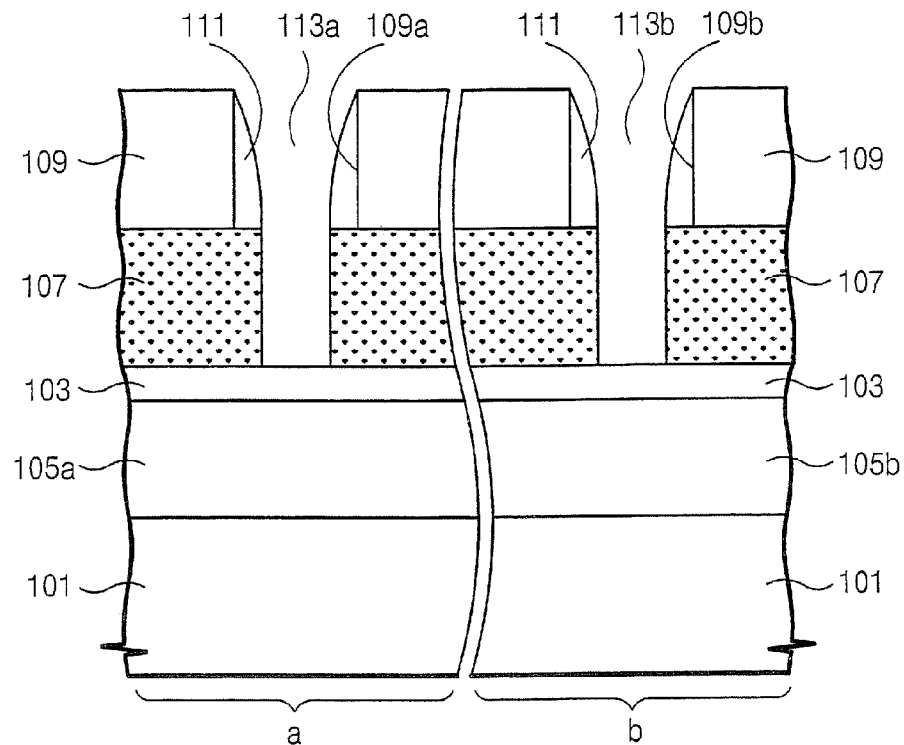

Referring to FIG. 12B, the capping layer 109 discussed with reference to FIG. 12A is patterned to form a first trench region 109a in the NMOS transistor region (a) and a second trench region 109b in the PMOS transistor region (b). Each one of the first trench region 109a and the second trench regions 109b exposes a portion of the molding layer 107. A trench spacer 111 is formed on each of the sidewalls of the first trench region 109a and the second trench region 109b using conventional methods. The trench spacer 111 may be formed from a CVD oxide layer, such as a plasma TEOS (tetraethylorthosilicate) layer. The molding layer 107 is etched in the anisotropic manner using the trench spacer 111 and the capping layer 109 as an etch mask to form the first preliminary gate pattern groove 113a and the second preliminary gate pattern groove 113b. The first preliminary gate pattern groove 113a and the second preliminary gate pattern groove 113b each expose a portion of the buffer layer 103. The relevant adjustment of the width of the trench spacer 111 may reduce the widths of the first preliminary gate pattern groove 113a and the second preliminary gate pattern groove 113b below the minimum design rule. The sidewalls of the first preliminary gate pattern groove 113a and the second preliminary gate pattern groove 113b are vertically profiled in the portion of the grooves penetrating the molding layer 107.

Figure 13B:
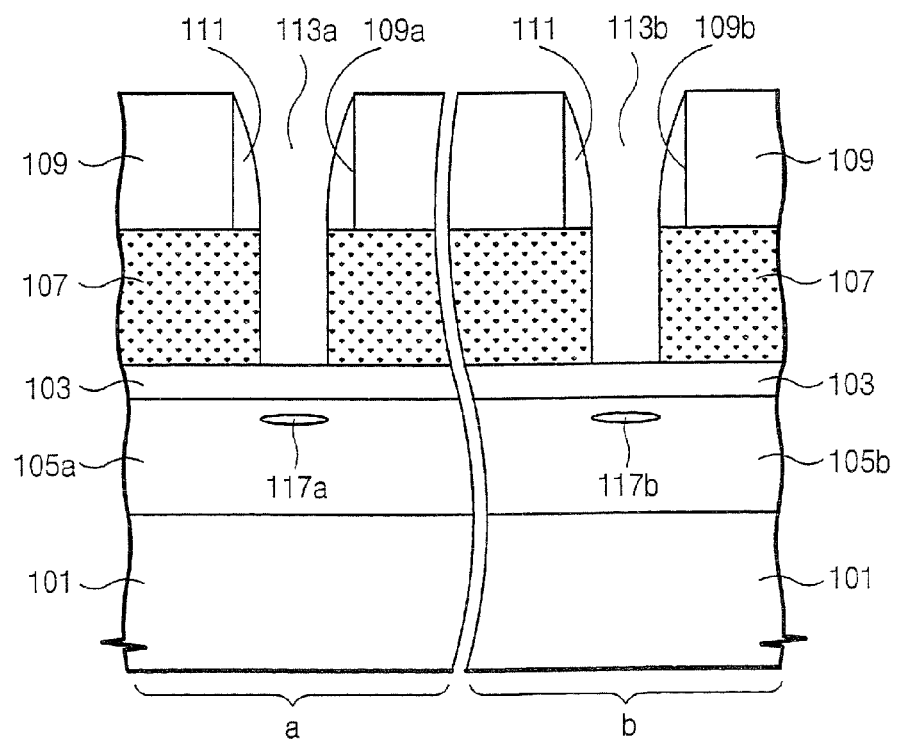
Figure 14B:
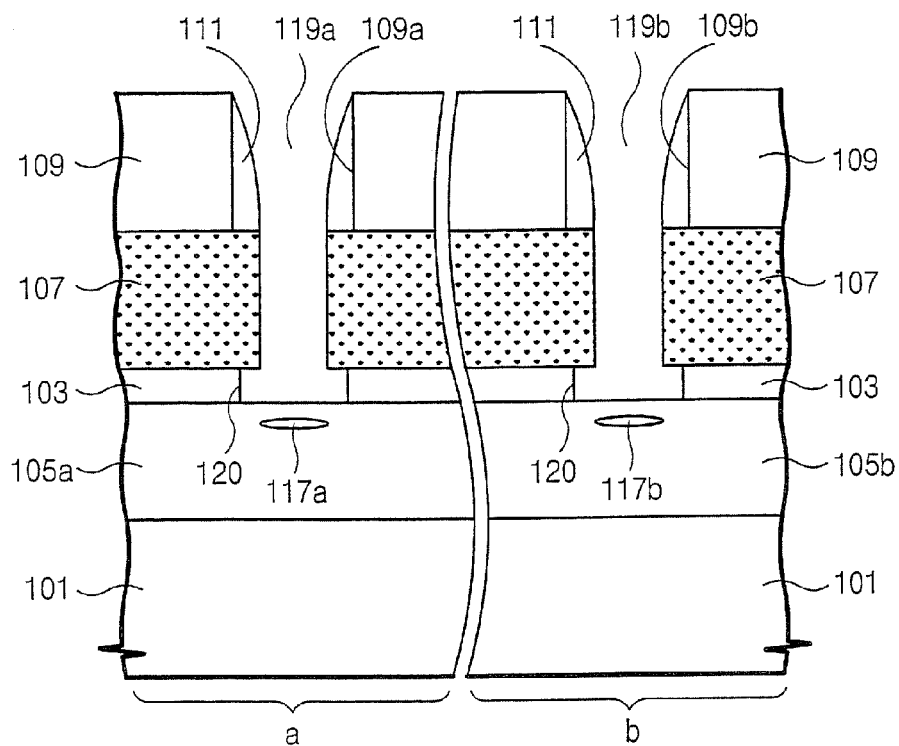

Referring to FIG. 13B, a first threshold voltage ion implantation region 117a and a second threshold voltage ion implantation region 117b are formed by the same method illustrated in FIG. 13A and discussed above. The step of forming the first threshold voltage ion implantation region 117a and the second threshold voltage ion implantation region 117b may be omitted. Next, as illustrated in FIG. 14B, the exposed buffer layer 103 is etched in isotropic manner so to form the first gate pattern groove 119a and the second gate pattern groove 119b.

FIGS. 12C-14C illustrate methods for forming the first preliminary gate pattern groove 113a, the second preliminary gate pattern groove 113b, the first gate pattern groove 119a, and the second gate pattern groove 119b according to further embodiments of the present invention.

Figure 12C:
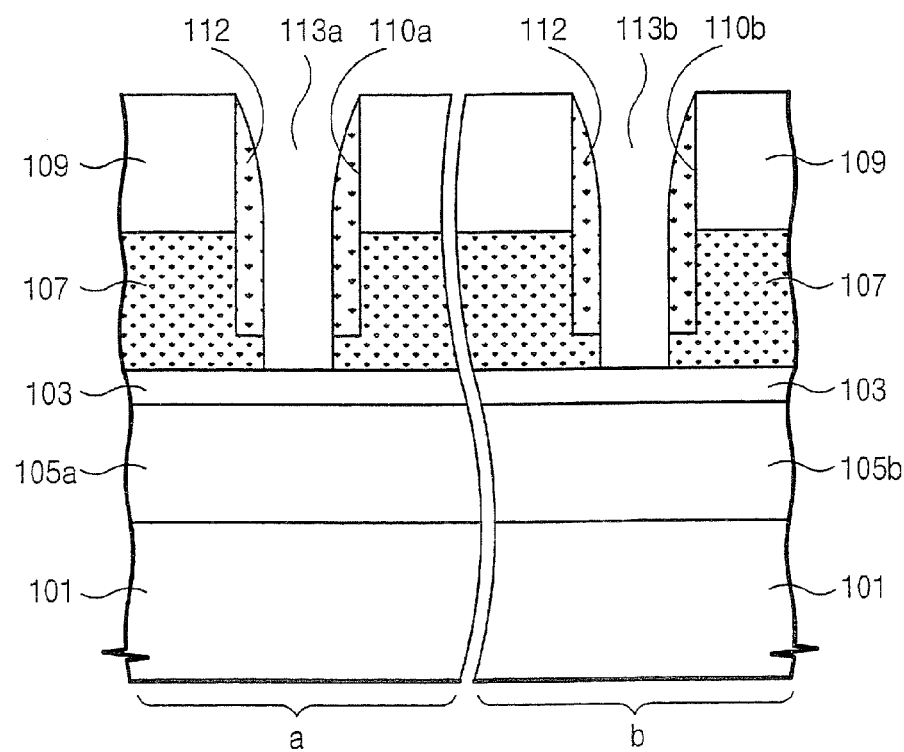

Referring to FIG. 12C, the capping layer 109 and the molding layer 107 are patterned to form a first trench region 110a in the NMOS transistor region (a) and a second trench region 10b in the PMOS transistor region (b). Both the first trench region 110a and the second trench region 110b are formed to have a depth smaller than total thickness of the molding layer 107 and the capping layer 109 so that a portion of the molding layer 107 remains under the first trench region 113a and the second trench region 113b. A conformal spacer dielectric layer is formed on the semiconductor substrate provided with the trench regions 110a and 110b. The spacer dielectric layer and the molding layer 107 may be formed from the same material layer or as a silicon nitride layer.

A portion of the molding layer 107 and the spacer dielectric layer are etched in the anisotropic manner to form trench spacers 112 on the sidewalls of the trench regions 110a and 110b, thereby forming the first preliminary gate pattern groove 113a and the second preliminary gate pattern groove 113b, each of which expose a portion of the buffer layer 103. The over-etching time to fully etch a portion of the molding layer 107 and the spacer dielectric layer is reduced as compared to the first modified method. Accordingly, the etch damage imposed on the semiconductor substrate 101 may be reduced dramatically during the step of forming the first preliminary gate pattern groove 113a and the second preliminary gate pattern groove 113b.

Figure 13C:
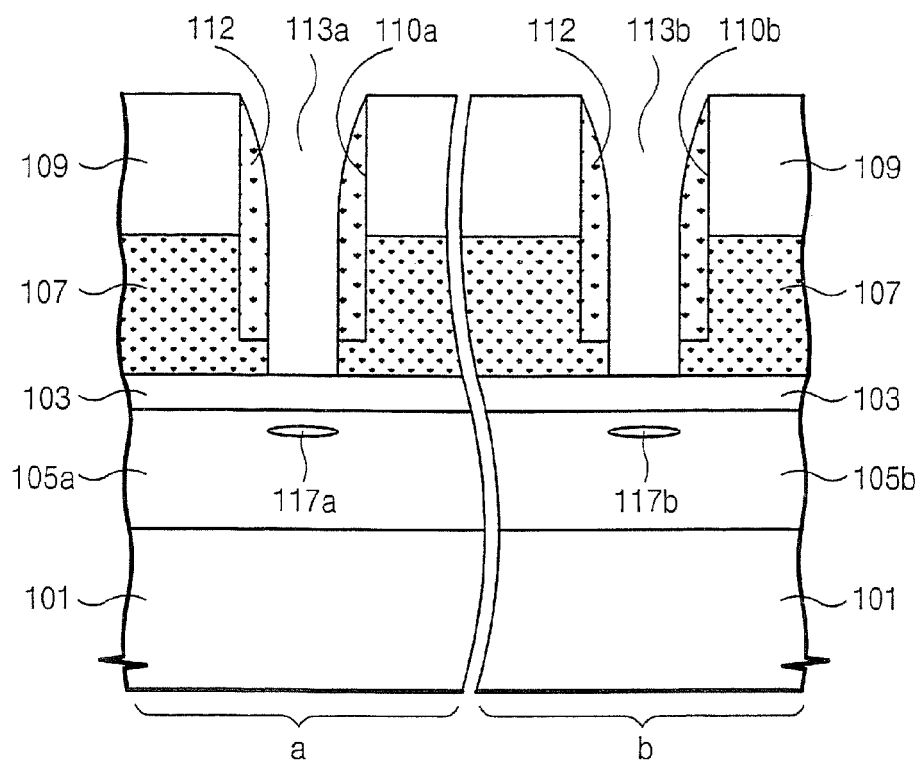
Figure 14C:
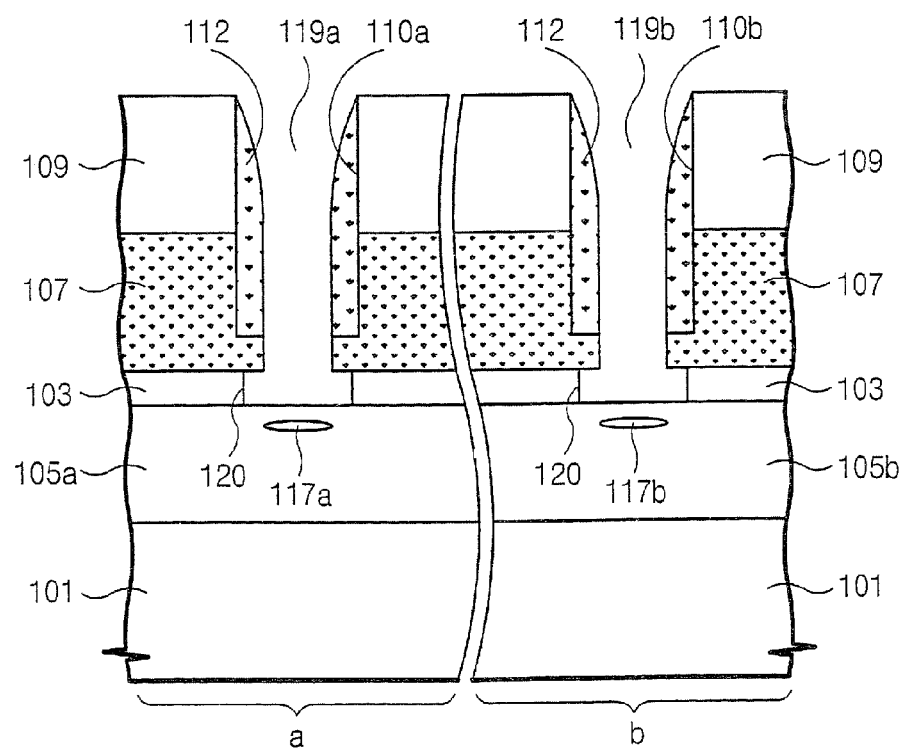

Referring to FIGS. 13C and 14C, a first threshold voltage ion implantation region 117a and a second threshold voltage ion implantation region 117b are formed by the same method discussed above and illustrated in FIG. 13A. The step of forming the first threshold voltage ion implantation region 117a and the second threshold voltage ion implantation region 117b may be omitted. Next, the exposed buffer layer 103 is etched an isotropic manner so as to form the first gate pattern groove 119a and the second gate pattern groove 119b illustrated in FIG. 14C.

Figure 15:
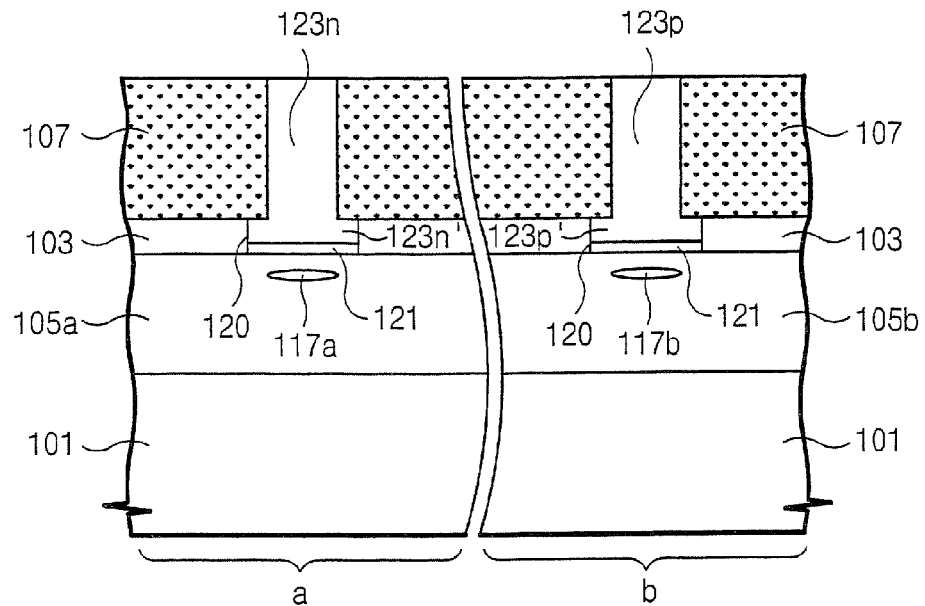

Referring to FIG. 15, a gate dielectric layer 121 is formed on both the portion of the p-well 105a that is exposed by the first gate pattern groove 119a and the portion of the n-well 105b that is exposed by the second gate pattern groove 119b. The gate dielectric layer 121 may be formed as a thermal oxide layer that has a thickness smaller than that of the buffer layer 103 so that an undercut region remains in the buffer layer 103. An undoped semiconductor layer is then formed that fills the first gate pattern groove 119a and the second gate pattern groove 119b. The undoped semiconductor layer may be formed, for example, as an undoped polysilicon layer or an undoped amorphous silicon layer.

The undoped semiconductor layer and the capping layer 109 are planarized until the upper part of the molding layer 107 is exposed so as to form a first gate pattern 123n in the first gate pattern groove 119a and a second gate pattern 123p in the second gate pattern groove 119b. As shown in FIG. 15, the first gate pattern 123n includes a pair of first protrusions 123n' that fill the undercut region in the NMOS transistor region (a) and the second gate pattern 123p includes a pair of second protrusions 123p' that fill the undercut region in the PMOS transistor region (b). Thus, the first gate pattern 123n and the second gate pattern 123p have an inverted T-shaped. The sidewalls of the first protrusions 123n' and the second protrusions 123p' in the embodiment depicted in FIG. 15 are vertically profiled.

Figure 16:
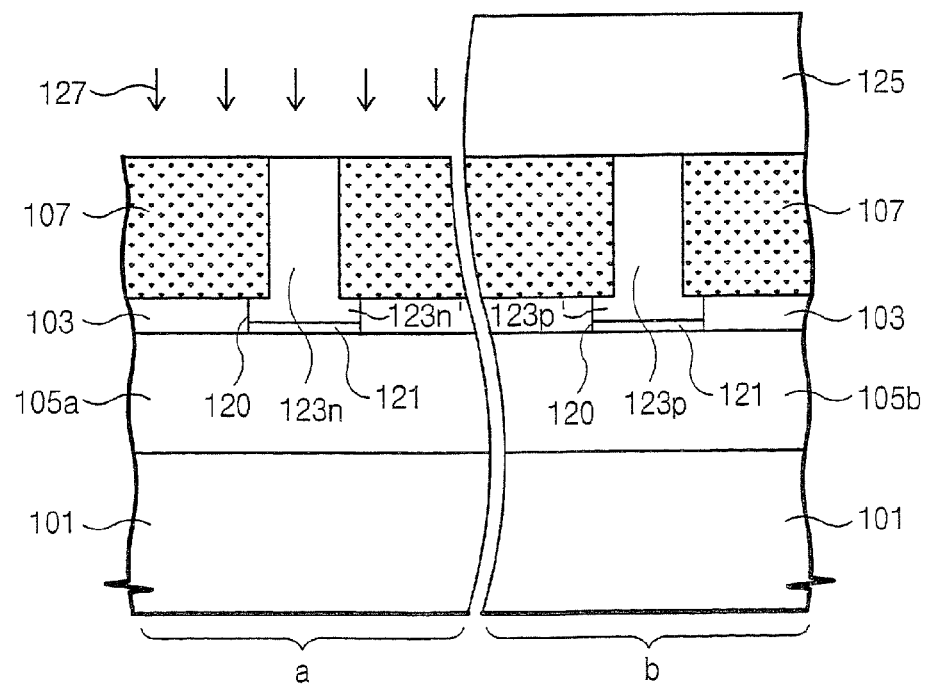

As shown in FIG. 16, a photoresist pattern 125 may then be formed on the PMOS transistor region (b). The surface of the first gate pattern 123n may be selectively implanted with n-type impurity ions using the photoresist pattern as an implant mask. The n-type impurity ions may, for example, be phosphorous ions or arsenic ions. Phosphorous ions may be preferred in certain embodiments as the n-type impurity ions because the diffusivity of the phosphorous ions is higher than that of the arsenic ions. The n-type impurity ions may be implanted at high dose of, for example, $1\times10^{15}$–$5\times10^{15}$ atoms/cm$^2$. The first gate pattern 123n may be damaged with crystal defects appearing on its surface. These crystal defects may be removed from the surface of the first gate pattern 123n via a wet etching process.

Figure 17:
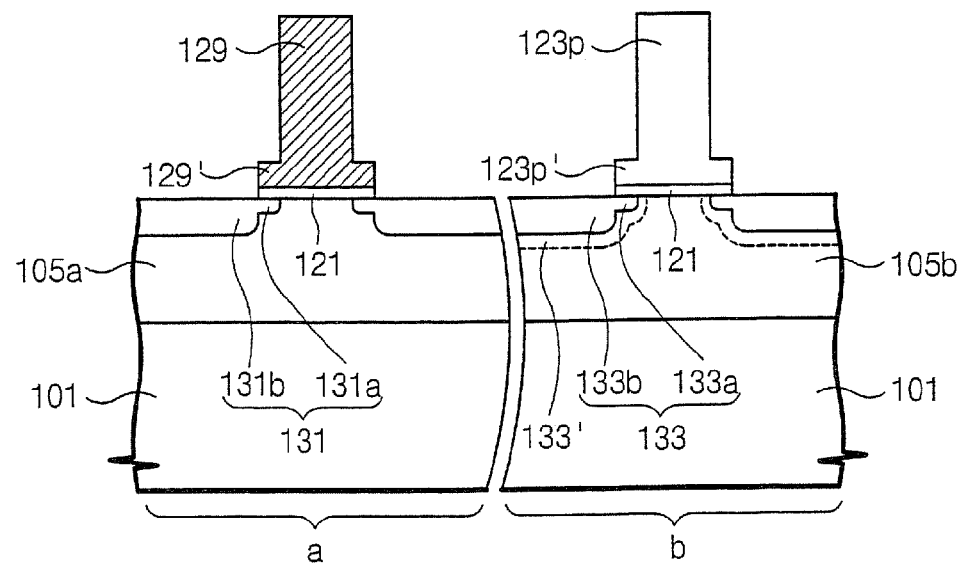

As shown in FIG. 17, the photoresist pattern 125 is then removed. Next, the first gate pattern 123n may be annealed to homogenously distribute the implanted n-type impurity ions so as to form a n-type gate electrode 129 having a pair of n-type protrusions 129'. Annealing during or after implantation also serves to cure the crystal defect damage imposed on the first gate pattern 123n. The annealing process may be performed, for example, using a rapid thermal process carried, for example, for about 10 seconds, within the range of 900° C.-1000° C. and under a nitrogen atmosphere.

The molding layer 107 and the buffer layer 103 may then be removed to expose the sidewalls of the second gate pattern 123p and the n-type gate electrode 129. The molding layer 107 may be removed using phosphoric acid ($H_3PO_4$) boiled at a temperature of about 150° C.-160° C., which will not etch the n-type gate electrode layer 129 or the second gate pattern 123p. The phosphorous acid can also be used to etch a portion of the buffer layer 103, thereby exposing the sidewalls of the n-type protrusions 129' and sidewalls of the second protrusions 123p'. A thin buffer layer residue (not shown) may remain on the p-well 105a and the n-well 105b. The buffer layer residue may, if desired, be removed by another etching process. Thus, even though the molding layer 107 is removed by wet etching, the n-type gate electrode 129 may be free of physical damage, and the n-type gate electrode 129 may be configured to have the same shape as the first gate pattern 123n.

The first active region adjacent the n-type gate electrode 129 is selectively implanted with n-type impurity ions using the n-type gate electrode 129 as an implant mask so as to define an n-channel region under the n-type gate electrode 129 and to simultaneously form a pair of n-type lightly-doped regions on both sides of the n-type channel. During this process, the PMOS transistor region (b) is under the protection of a photoresist pattern (not shown in FIG. 17). The n-type impurity ions may be implanted at a dose of, for example, $1\times10^{15}$–$5\times10^{15}$ atoms/cm$^2$ thereby forming the pair of second lightly-doped regions 131b depicted in FIG. 17. A portion of the n-type impurity ions are implanted with sufficient energy to penetrate the n-type protrusions 129' to form the pair of first n-type lightly-doped regions 131a shown in FIG. 17. As shown in FIG. 17, the second n-type lightly-doped regions 131b are deeper than the first n-type lightly-doped regions 131a.

The second active region adjacent the second gate pattern 123p is selectively implanted with p-type impurity ions using the second gate pattern 123p as an implant mask so as to define a p-channel region under the second gate pattern 123p and to simultaneously form a pair of p-type lightly-doped regions on both sides of the p-type channel. During this implantation process, the NMOS transistor region (a) is protected by a photoresist pattern. Each p-type lightly-doped region 133 comprises a first p-type lightly-doped region 133a and a second p-type lightly-doped region 133b, the first p-type lightly-doped region 133a being formed on the second active region under one of the second protrusions 123p' and the second p-type lightly-doped region 133b being adjacent to the first p-type lightly-doped region 133a. The second p-type lightly-doped region 133b is deeper than the first p-type lightly-doped region 133a. In additional embodiments of the present invention, the p-type lightly-doped region 133 described above may be replaced with an n-type pocket impurity region 133'. The use of n-type pocket impurity regions 133' in place of the p-type lightly-doped regions may have the effect of improving the short channel effect. The n-type pocket impurity regions 133' may be as deep as, or deeper than, the p-type lightly-doped regions 133.

Figure 18:
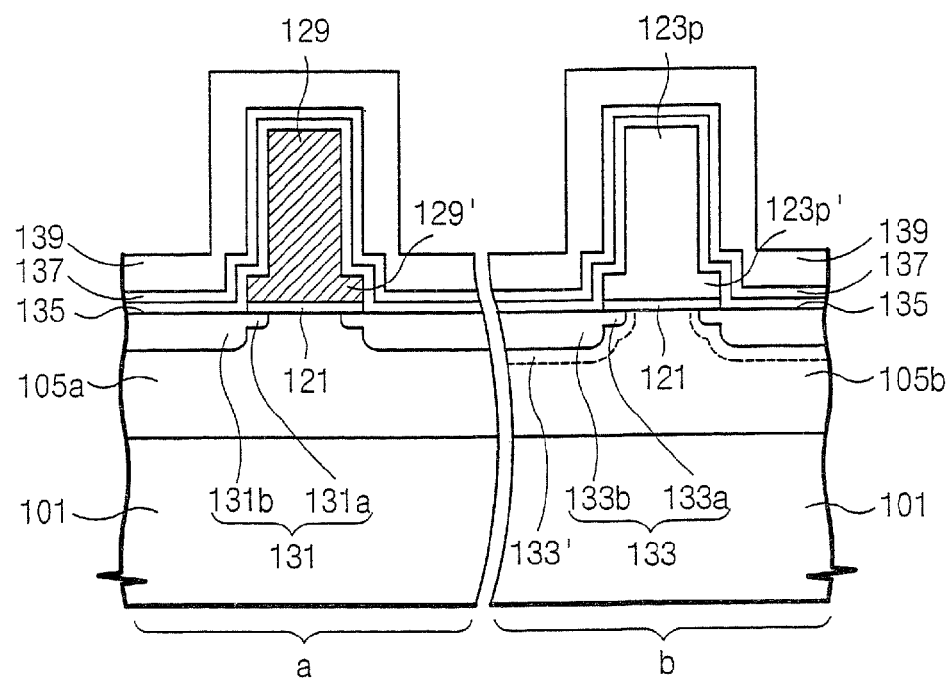

The device may then be thermally oxidized to form a curing thermal oxide layer 135 on the semiconductor substrate and on the gate patterns (see FIG. 18). The thermal oxidizing process may recover the gate dielectric layer 121 under the n-type protrusions 129' and the second protrusions 123p' and may help cure damage in the semiconductor substrate. As shown in FIG. 18, a spacer etch stop layer 137 and a spacer dielectric layer 139 may be formed successively on the curing thermal oxide layer 135. The spacer etch stop layer 137 may be formed from a material having an etch selectivity with respect to the spacer dielectric layer 139. For instance, if the spacer dielectric layer 139 comprises a silicon oxide layer, the spacer etch stop layer 137 may be formed as a silicon nitride layer (or vice versa). In embodiments of the present invention, (such as where the spacer dielectric layer 139 is formed from a silicon nitride layer), the space etch stop layer 137 need not be formed.

Figure 19:
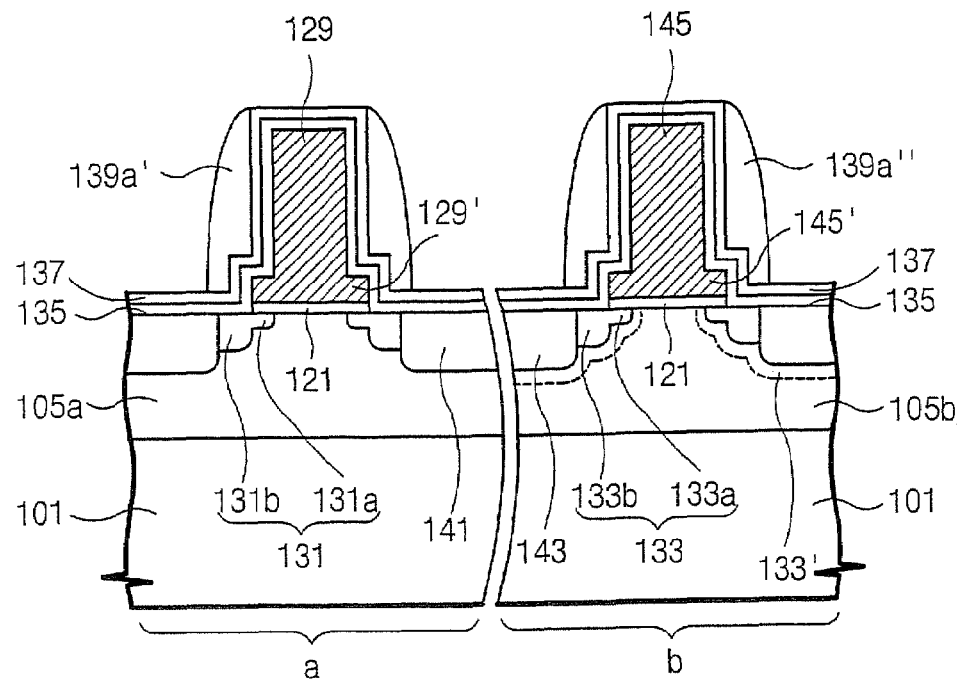

As shown in FIG. 19, the spacer dielectric layer 139 may be etched in an anisotropic manner to form first gate spacers 139a' on each of the sidewalls of the n-type gate electrode 129 and to form second gate spacers 139a'' on each of the sidewalls of the second gate pattern 123p. The first active region adjacent the n-type gate electrode 129 is implanted with n-type impurity ions using the n-type gate electrode 129 and the first gate spacer 139a' as an implant mask so as to form a pair of n-type heavily-doped regions 141 in the first active region adjacent to the outer sidewall of each of the first gate spacers 139a'. The n-type source/drain regions in the device include the n-type lightly-doped regions 131 and the n-type heavily-doped regions 141. The n-type highly-doped regions 141 may be deeper than the second n-type lightly-doped regions 131b to reduce the electrical resistance of the n-type source/drain regions.

The second active region adjacent the second gate pattern 123p is implanted with p-type impurity ions using the second gate pattern 123p and the second gate spacers 139a" as an implant mask to form a pair of p-type heavily-doped regions 143 in the second active region adjacent to the outer sidewall of each second gate spacer 139a". The second gate pattern 123p is annealed to homogenously distribute the p-type impurity ions so as to form the p-type gate electrode 145. As shown in FIG. 19, the p-type gate electrode 145 has p-type protrusions 145', and the p-type source/drain regions consists of the p-type lightly-doped regions 133 and the p-type heavily-doped regions 143. The p-type heavily-doped regions 143 may be deeper than the second p-type lightly-doped regions 133b to reduce the electrical resistance of the p-type source/drain regions. In the case where the n-type pocket impurity region 133' is formed, at least sidewalls of the p-type heavily-doped regions 143 are enclosed within the n-type pocket impurity region 133'.

Figure 20:
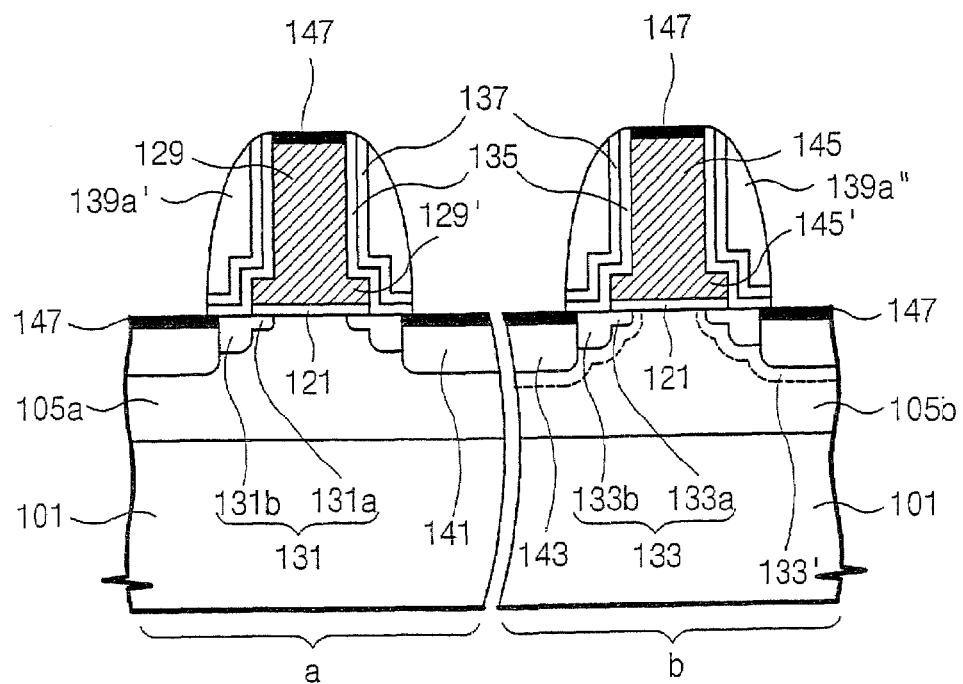

Referring to FIG. 20, both the spacer etch stop layer 137 and the curing thermal oxide layer 135 may be patterned and cleaned to expose an upper part of the n-type gate electrode 129, an upper part of the p-type gate electrode 145, the top surfaces of the n-type heavily-doped regions 141, and the top surfaces of the p-type heavily-doped regions 143. Next, a metal silicide layer 147 is selectively formed on the exposed surfaces of the gate electrodes 129 and 145 and on the exposed surfaces of the heavily-doped regions 141 and 143 using conventional techniques. The leakage current characteristic between the metal silicide layer 147 and the wells 105a and 105b of the resulting device may be improved by provision of the relatively deep second lightly-doped regions 131b and 133b. In addition, the n-type gate electrode 129 may be is sufficiently thick. Accordingly, even though an annealing process may be carried out to form the metal silicide layer 147, an impurity-depleted region is not formed in the n-type gate electrode 129.

FIGS. 21A, 21B, 21C, and 22-25 are sectional views illustrating a method for fabricating a CMOS transistor according to second embodiments of the present invention. In these second embodiments, the buffer layer may have a thickness of less than 100 Å. Detailed duplicating descriptions of fabrication steps that are carried out in both the first and second embodiments will be abbreviated in the following description.

Figure 21A:
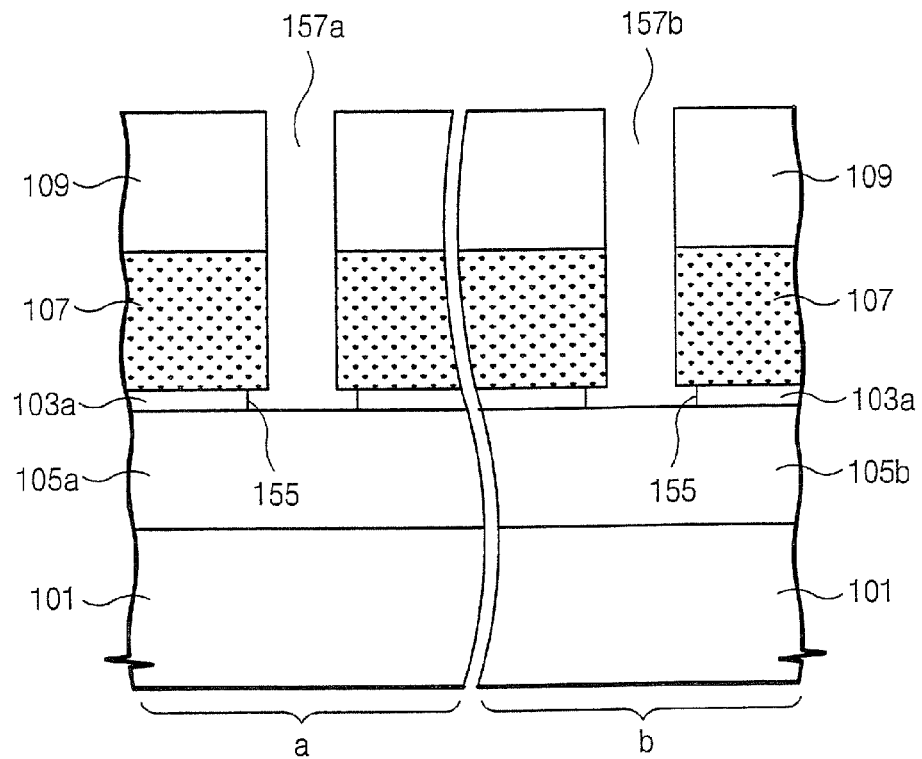
Figure 21B:
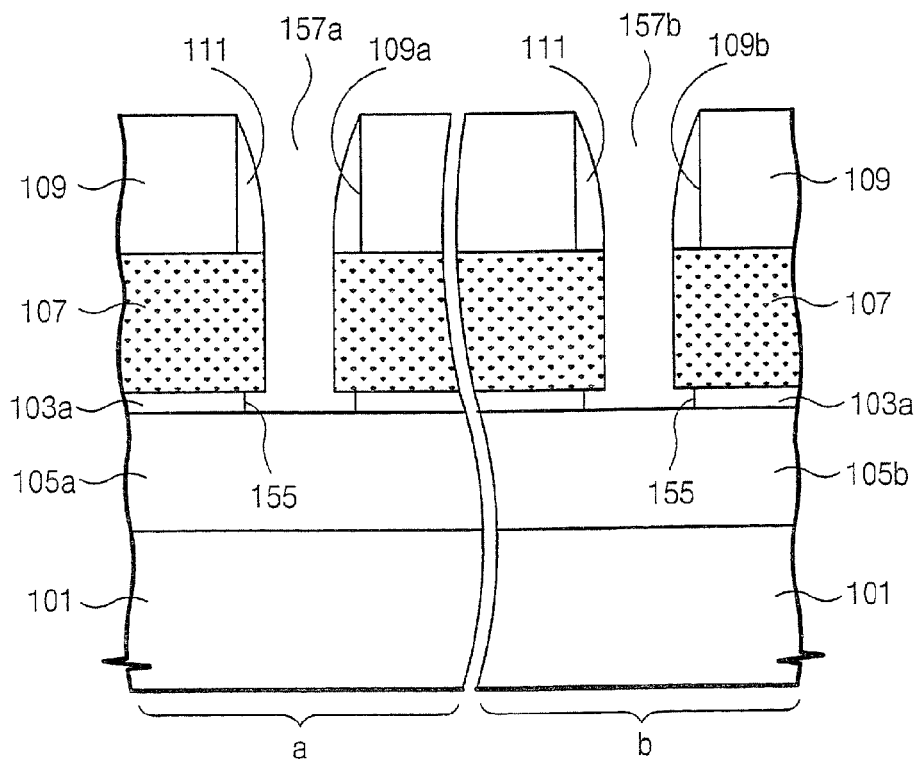

Referring to FIGS. 11, 12A, 13A, 21A, 21B, and 21C, a buffer layer 103a, the molding layer 107, and a capping layer 109 are formed on the semiconductor substrate 101 using the method described above with respect to FIGS. 11 and 12A. The buffer layer 103a is formed to a thickness of less than 100 Å. A first preliminary gate pattern groove 113a, a second preliminary gate pattern groove 113b, a first threshold voltage ion implantation region 117a, and a second threshold voltage ion implantation region 117b are formed using the techniques described above with respect to FIG. 13A. Next, the exposed buffer layer 103a is etched in an isotropic manner in order to form a first gate pattern groove 137a in the NMOS transistor region (a) and a second gate pattern groove 137b in the PMOS transistor region (b). Thus, as shown in FIG. 21A the first gate pattern groove 157a and the second gate pattern groove 157b each have an undercut region formed in the buffer layer 103a. The sidewalls of these undercut regions have a relatively vertical profile. As illustrated in FIGS. 21B and 21C, the techniques described with respect to FIGS. 12B-14B or FIGS. 12C-14C may also be used to fabricate devices according to second embodiments of the present invention.

Figure 22:
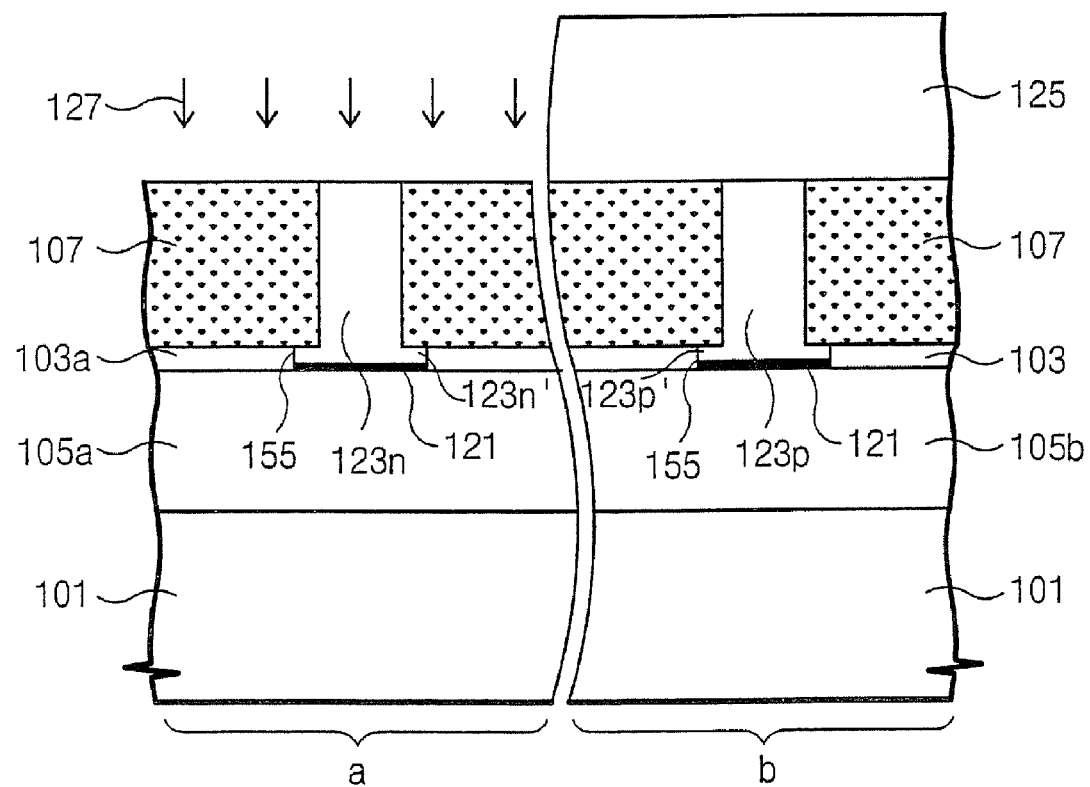

Referring to FIG. 22, gate dielectric layers 121 are formed on surfaces of the p-well 105a and the n-well 105b by the same methods described above with respect to the first embodiments of the present invention. Next, a first gate pattern 123n and a second gate pattern 123p are formed by the same methods described above with respect to the first embodiments of the present invention. As shown in FIG. 22, the first gate pattern 123n includes first protrusions 123n' filling the undercut region in the NMOS transistor region (a) and the second gate pattern 123p includes second protrusions 123p' filling the undercut region in the PMOS transistor region (b). Since the buffer layer 103a has a thickness of less than 100 Å, the sidewalls of the first protrusions 123n' and the second protrusions 123p' are also less than 100 Å thick. Next, a photoresist pattern 125 is formed on the PMOS transistor region (b) and n-type impurity ions 127 are selectively implanted using the technique described above with respect to the first embodiments of the present invention. After the photoresist pattern 125 is removed, the first gate pattern 123n is annealed to form an n-type gate electrode 129, and then the molding layer 107 and the buffer layer 103a are wet-etched to expose the sidewalls of the n-type gate electrode 129 and the sidewalls of the second gate pattern 123p by the methods described above with respect to the first embodiments of the present invention.

Figure 23:
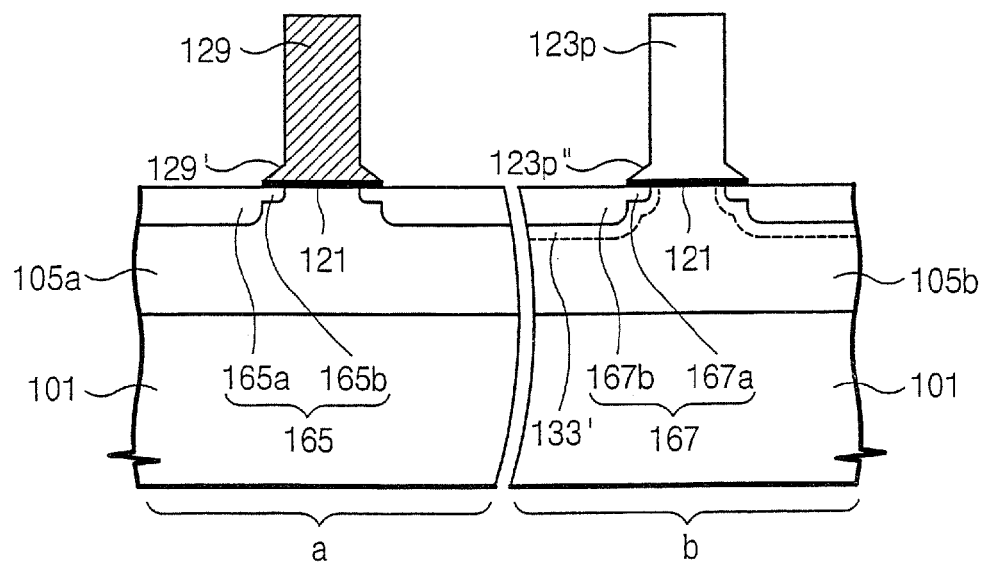

As shown in FIG. 23, a pair of n-type lightly-doped regions 165 are formed in the NMOS transistor region (a) and a pair of p-type lightly-doped regions 167 are formed in the PMOS transistor region (b). This may be accomplished using the ion implantation techniques described above with respect to the first embodiments of the present invention. The n-type lightly-doped regions 165 each consist of a first n-type lightly-doped region 165a and second n-type lightly-doped region 131b adjacent to the first n-type lightly-doped region 165a. The p-type lightly-doped regions 167 each consist of a first p-type lightly-doped region 167a and second p-type lightly-doped region 167b. An n-type pocket impurity region 133' may be formed instead of the p-type lightly-doped regions 167.

FIG. 22 illustrates the ion implantation process used to form the lightly-doped regions 165 and 167, the upper edges of the first protrusions 123n' and the upper edges of the second protrusions 123p'. In the process used to remove the photoresist used as an implant mask for forming the lightly-doped regions 165 and 167, or in a cleaning process, the upper edges of the protrusions 123n' and 123p' may be etched to have protrusions 129' and 123p' that are sloped at positive angles as shown in FIG. 23 (i.e., the width of the upper part of each of the protrusion 129' and 123p' is less than the width of the lower part of the protrusion).

The curvature of each of the first n-type lightly-doped regions 165a may be higher than the curvature of the first n-type lightly-doped regions 131a described above with respect to the first embodiments of the present invention. This higher degree of curvature may occur because the first protrusion 123n' is relatively thin and/or because the implant in the second embodiments is graded in terms of penetration because it is implanted through gate electrode protrusions having graded thickness. Similarly, the curvature of the first p-type lightly-doped regions 167a may be higher than the curvature of the first n-type lightly-doped regions 133a described above with respect to the first embodiments of the present invention. As a result, the second embodiments may suppress the hot carrier effect as compared to the first embodiments.

As in the first embodiments described above, an n-type pocket impurity region 167' may be formed instead of the p-type lightly-doped regions 167.

Figure 24:
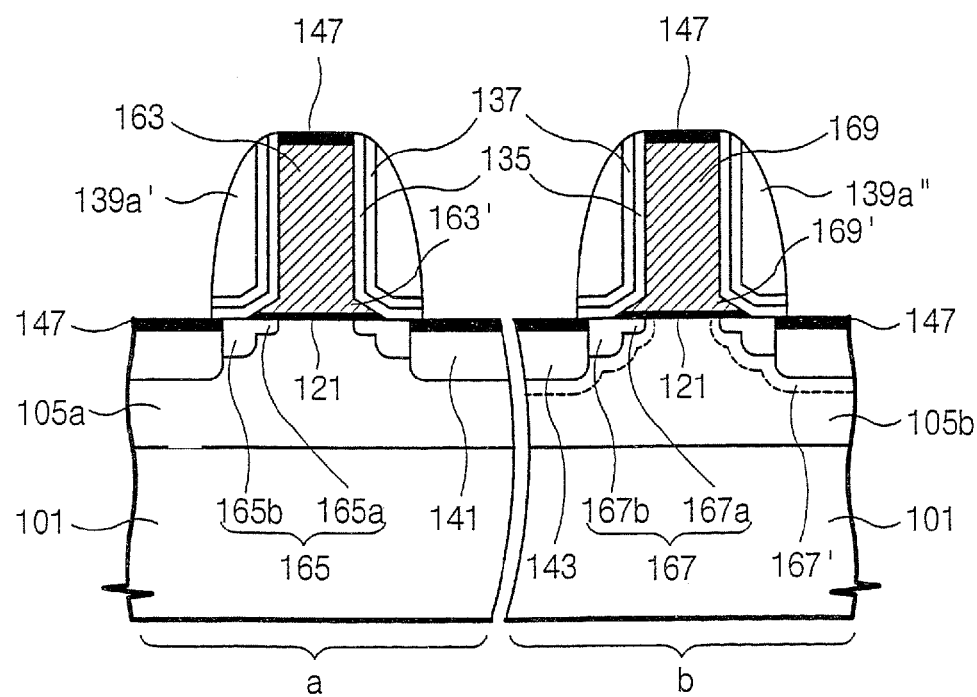

As shown in FIG. 24, an "inverted T-shaped" n-type gate electrode 163 is formed in the NMOS transistor region (a) and an "inverted T-shaped" p-type gate electrode 169 is formed in the PMOS transistor region (b) using the same methods described above. The n-type gate electrode 163 includes a pair of n-type protrustions 163' and the p-type gate electrode 169 includes a pair of p-type protrusions 169'. The p-type protrusions 169' and the n-type protrusions 163' are sloped at positive angles. By "sloped at positive angles " it is meant that the width of the lower part in the protrusions 163' and 169' is greater than the width of the upper part of the protrusions.

Using the same methods described above with respect to the first embodiments of the present invention, a curing thermal oxide layer 135, a spacer etch stop layer 137, spacer dielectric layers 139a' and 139a" an n-type heavily-doped junction 141 and a p-type heavily-doped junction 143 may be formed.

FIGS. 25-29 are sectional views illustrating a CMOS transistor according to third embodiments of the present invention. In these third embodiments, the buffer layer may have a thickness of 300 Å-500 Å.

Figure 25:
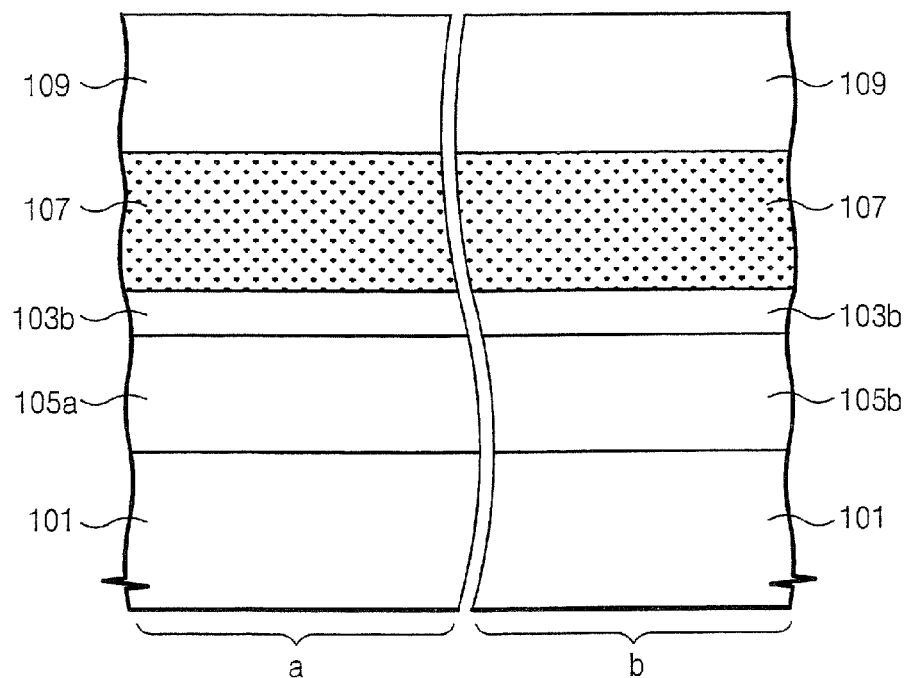
FIGS. 25-29 are cross-sectional views illustrating steps of methods according to embodiments of the present invention for fabricating the MOS transistor of FIG. 10.

Referring to FIG. 25, a buffer layer 103b, a molding layer 107 and a capping layer 109 are formed subsequently on the semiconductor substrate 101 having an NMOS transistor region (a) and a PMOS transistor region (b) using the methods described above. A p-well 105a and an n-well 105b are then formed in the NMOS transistor region (a) and the PMOS transistor region (b), respectively.

Figure 26A:
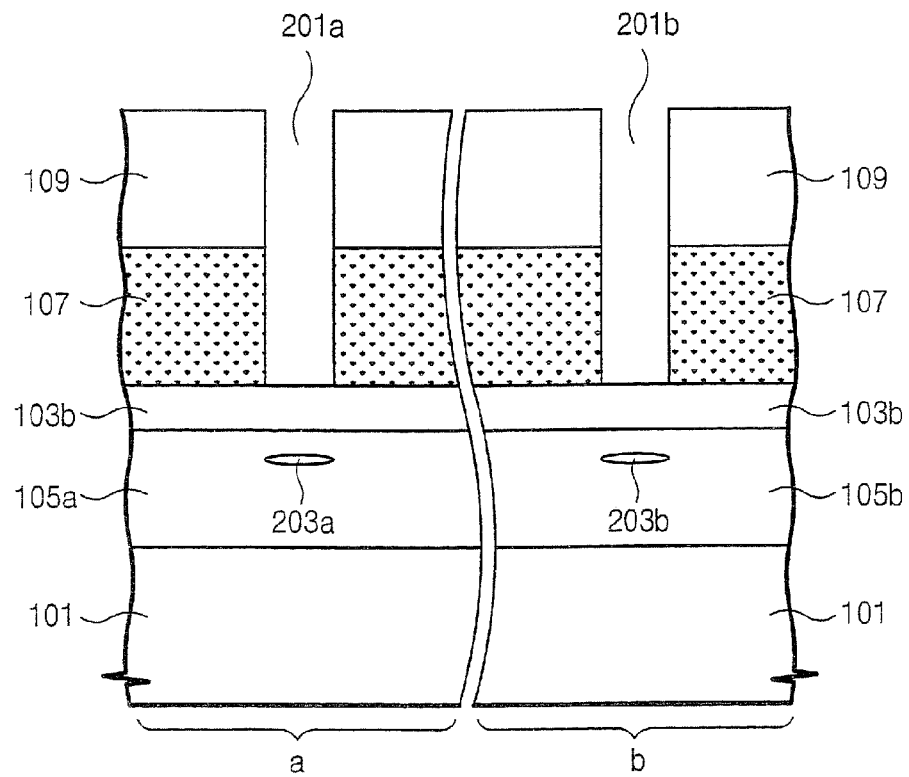

As shown in FIG. 26A, the capping layer 109 and the molding layer 107 may then be patterned to form a first preliminary gate pattern groove 201a in the NMOS transistor region (a) and a second preliminary gate pattern groove 201b in the PMOS transistor region (b). The first preliminary gate pattern groove 201a exposes a portion of the buffer layer 103b in the NMOS transistor region (a), and the second preliminary gate pattern groove 201b exposes a portion of the buffer layer 103b in the PMOS transistor region (b). The process used to form the capping layer 109 may be omitted, in which case only the molding layer 107 is patterned to form the first preliminary gate pattern groove 201a and the second preliminary gate pattern groove 201b. Next, using the methods described above, a first threshold voltage ion implantation region 203a and a second threshold voltage ion implantation region 203b may be formed in the NMOS transistor region (a) and the PMOS transistor region (b), respectively.

Figure 27A:
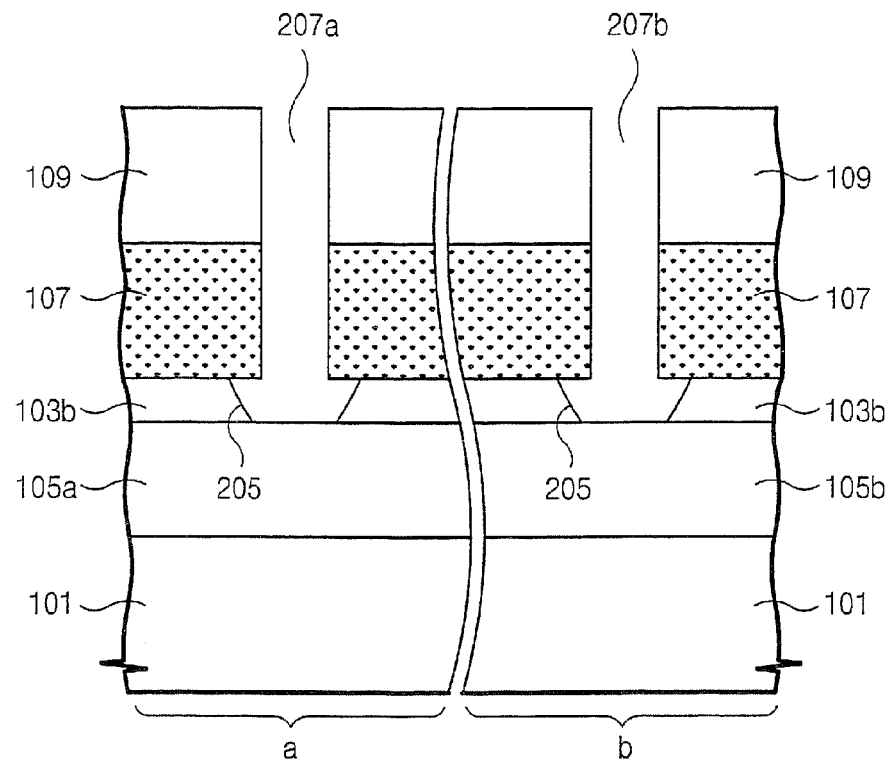

As shown in FIG. 27A, the exposed buffer layer 103b is etched in an isotropic manner so as to form a first gate pattern groove 207a and a second gate pattern groove 207b. The first gate pattern groove 207a exposes a portion of the p-well 105a and the second gate pattern groove 207b exposes a portion of the n-well 105b such that both the first gate pattern groove 207a and the second gate pattern groove 207b have an undercut region formed in the buffer layer 103b. As shown in FIG. 27, the sidewalls of the undercut region are sloped at negative angle such that the width of the upper part of the undercut region is greater than the width of the lower part of the undercut region.

Pursuant to further embodiments of the present invention, the first preliminary gate pattern groove 201a, the second preliminary gate pattern groove 201b, the first gate pattern groove 207a, and the second gate pattern groove 207b may be formed using various alternative techniques, such as the techniques discussed below with reference to FIGS. 26B and 27B and with reference to FIGS. 26C and 27C.

Figure 26B:
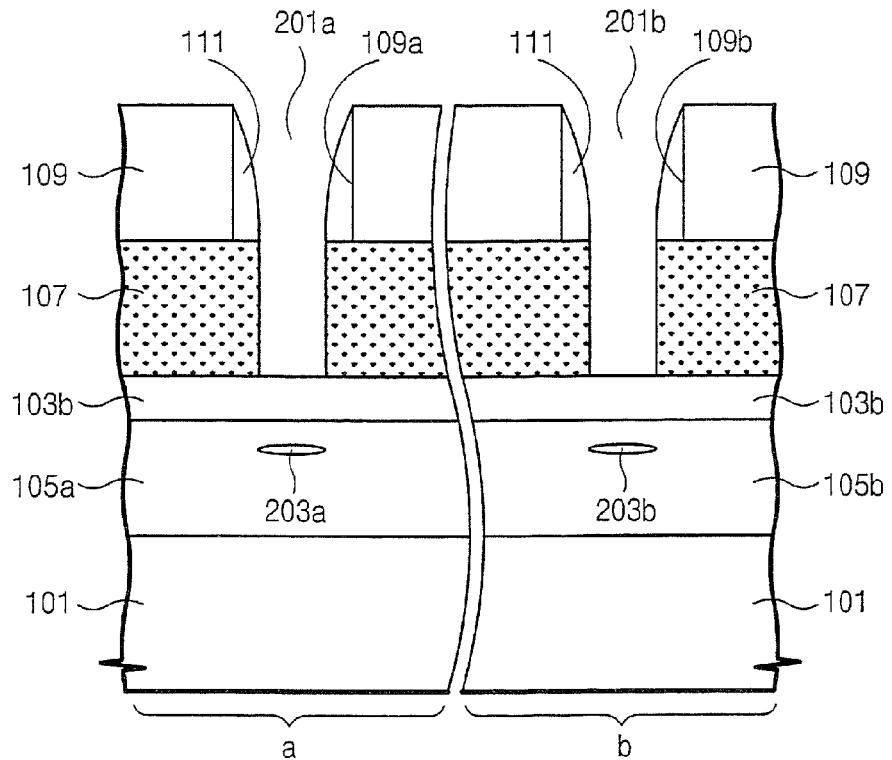
Figure 27B:
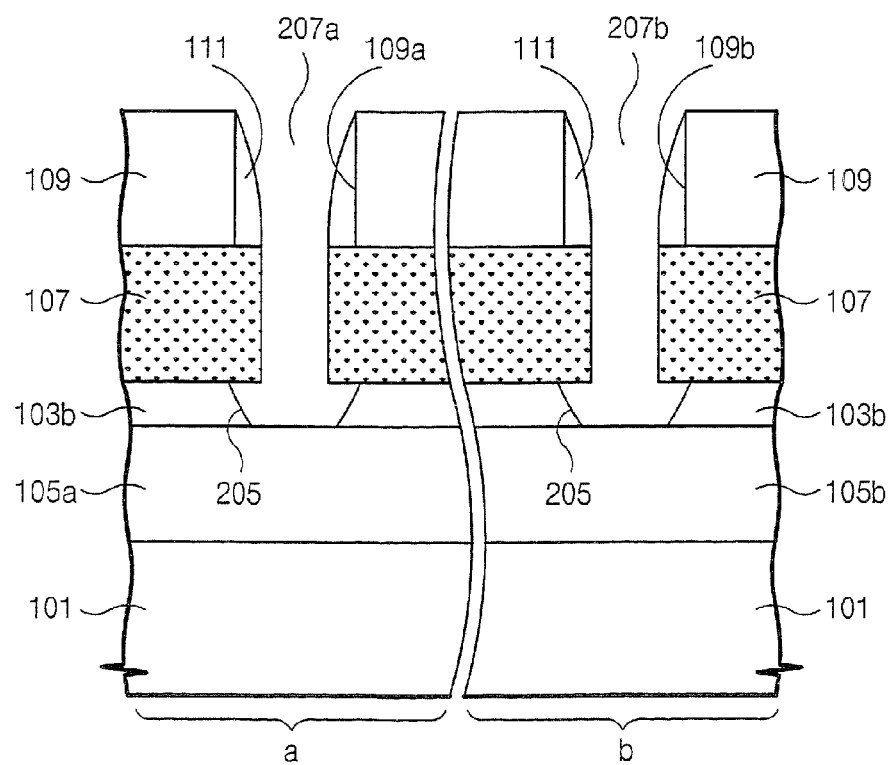

As shown in FIGS. 26B and 27B, a first trench region 109a, a second trench region 109b and a trench spacer 111 are formed using the method described with respect to FIG. 13B. The molding layer 107 is etched using the patterned capping layer 109 and the trench spacer 111 as an etch mask so as to form the preliminary gate pattern groove 201a and the second preliminary gate pattern groove 201b. The preliminary gate pattern groove 201a and the second preliminary gate pattern groove 201b each expose a portion of the buffer layer 103b. Next, the exposed buffer layer 103b is etched in an isotropic manner in order to form an undercut region having a negative sloped profile in the buffer layer 103b (see FIG. 27B) to form the first gate pattern groove 207a and the second gate pattern groove 207b.

Figure 26C:
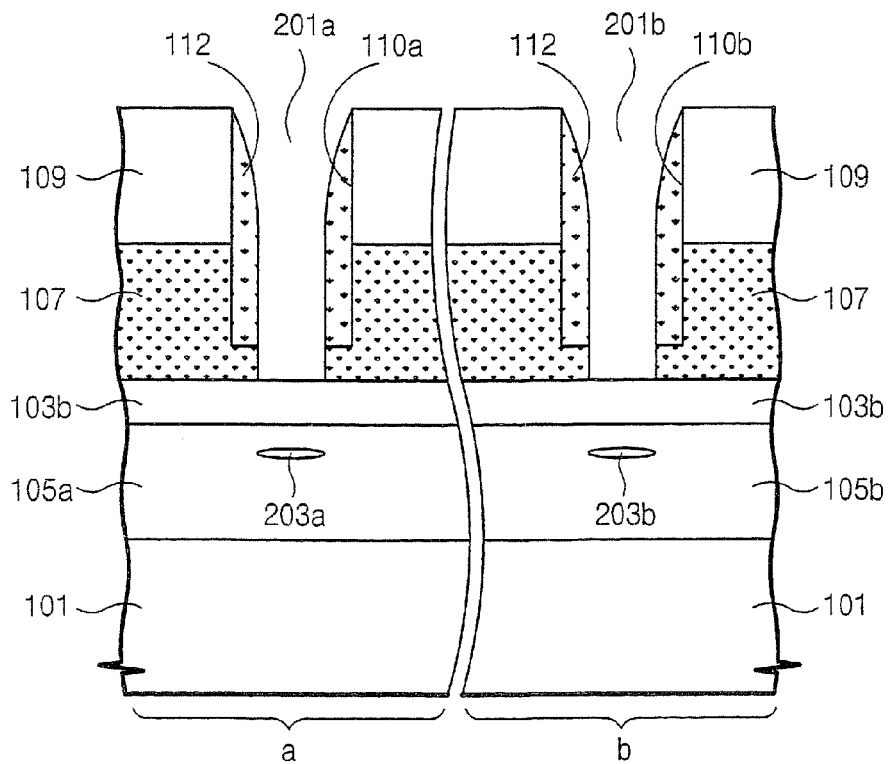
Figure 27C:
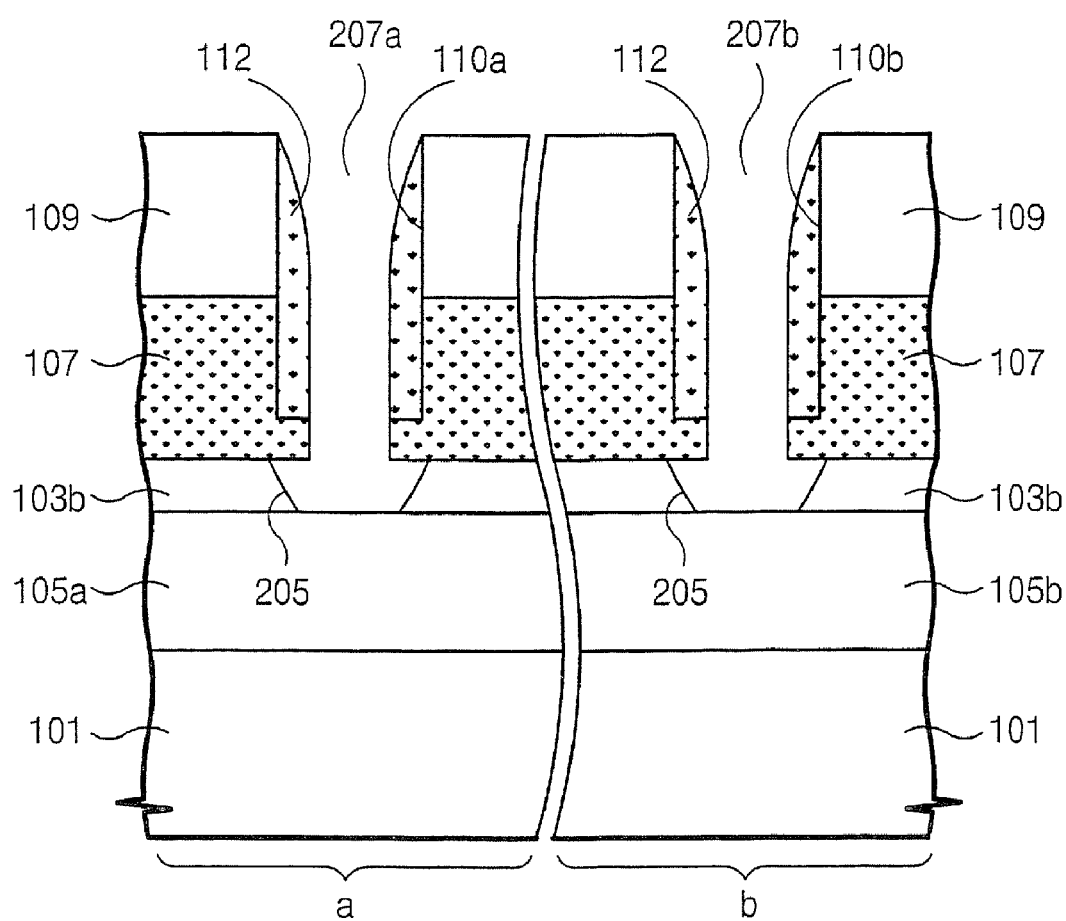

As shown in FIGS. 26C and 27C according to further embodiments of the present invention, the preliminary gate pattern groove 201a and the second preliminary gate pattern groove 201b may be formed to expose portions of the buffer layer 103b. Next, the exposed buffer layer 103b is etched in an isotropic manner so as to form the first gate pattern groove 207a and the second gate pattern groove 207b.

Figure 28:
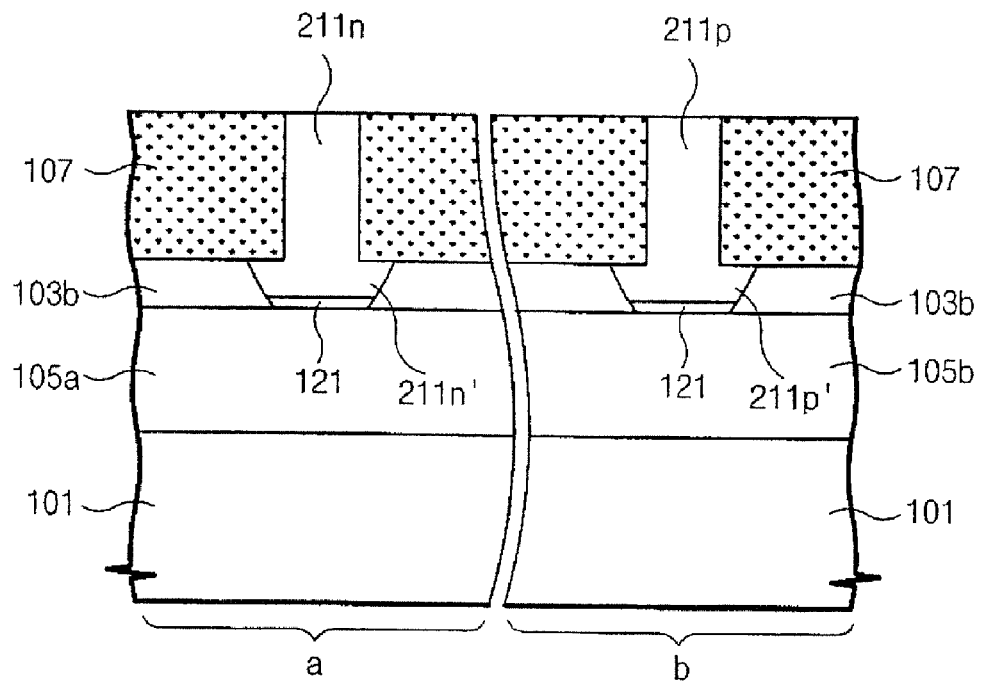

Referring now to FIG. 28, a gate dielectric layer 121 may be formed on surfaces of the p-well 105a and the n-well 105b that are exposed by the first gate pattern groove 157a and the second gate pattern groove 157b. Next, using the method described above with respect to the first embodiment, a first gate pattern 211n may be formed in the first gate pattern groove 207a and a second gate pattern 211p may be formed in the second gate pattern groove 207b. The first gate pattern 211n includes first protrusions 211n' and the second gate pattern 211p includes second protrusions 211p' that fill the undercut region. The sidewalls of the first protrusions 211n' and the second protrusions 211p' are sloped at negative angles (i.e., the width of the upper part of the protrusion 211n' and is greater than the width of the lower part of the protrusions 211n' and 211p'.

Figure 29:
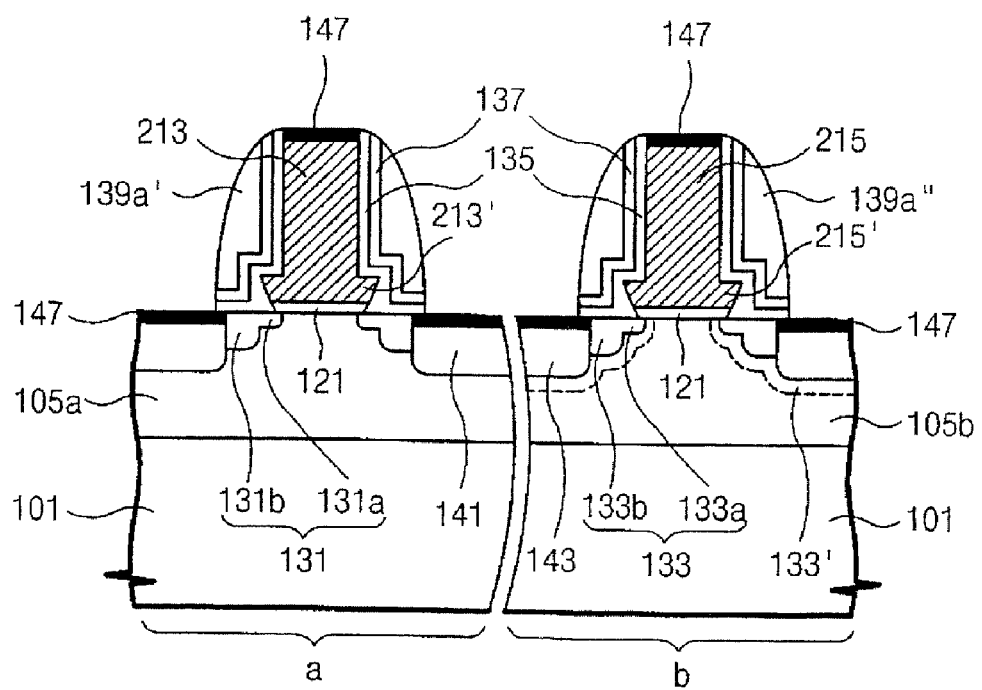

As shown in FIG. 29, an n-type gate electrode 213 is formed in the NMOS transistor region (a) and a p-type gate electrode 215 is formed in the PMOS transistor region (b) using the method described above with respect to the first embodiments of the present invention. Consequently, the n-type gate electrode 213 has n-type protrusions 213' and the p-type gate electrode 215 and has p-type protrusions 215'. The n-type protrusions 213' and the p-type protrusions 215' have a negative sloped profile. This may sharply reduce the parasitic capacitance between the n-type lightly-doped regions 131 and the n-type gate electrode 213 and between the p-type lightly-doped regions 133 and the p-type gate electrode 215.

As described in the above, according to embodiments of the present invention the gate electrode may have a vertical profile, a positive sloped profile, or a negative sloped profile. The thicknesses of the buffer layer as described above are just examples and it will be appreciated by those skilled in the art that the thickness of the buffer layer can be modified according to the process conditions.

As is also described above, according to embodiments of the present invention, a first lightly-doped region may be formed under each of the protrusions of the "inverted T-shaped" gate electrode, and a second lightly-doped region may be formed under each of the gate spacers. The second lightly-doped regions may be deeper than the first lightly-doped regions. A heavily-doped region may also be formed on the semiconductor substrate adjacent to each of the second lightly-doped regions. Accordingly, the electrical resistance of the second lightly-doped regions and hence the source/drain regions can be reduced without degrading the short channel effect that is related to the depth of the first lightly-doped regions. Moreover, in devices that include a metal silicide layer on the heavily-doped region, the leakage current characteristic between the metal silicide layer and the semiconductor substrate can be improved owing to the presence of the second lightly-doped regions.

In addition, the "inverted T-shaped" gate electrode may be formed by a damascene process employing the molding layer. In this process, after the implanting the "inverted T-shaped" gate electrode with n-type impurity ions and annealing, the molding layer is removed. As a result, the n-type gate electrode may be protected from physical damage during the step of removing the molding layer.

According to embodiments of the present invention, devices having an "inverted T-shaped" gate electrode are provided. As should be clear from the above description, as used herein, the term "inverted T-shaped gate electrode" refers to any gate electrode having a cross-sectional shape that generally resembles an inverted T, including gate electrodes having cross-sectional shapes wherein the sidewalls of the crossbar portion of the "T" are angled at either positive or negative slopes (such as the inverted T-shaped gate electrodes depicted in FIGS. 9 and 10).

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A method of fabricating a MOS transistor, the method comprising:
    defining an active region in a semiconductor substrate;
    forming a first layer on the surface of the substrate;
    forming a second layer on the first layer;
    forming a groove that penetrates the second layer and the first layer, wherein a width of the groove in the first layer is greater than a width of the groove in the second layer so as to form a pair of undercut regions in the first layer; and
    forming a gate pattern on the active region and in the groove, the gate pattern having a first lateral protrusion extending from a lower portion of a first sidewall of the gate pattern and a second lateral protrusion extending from a lower portion of a second sidewall of the gate pattern so as to provide a gate pattern having an inverted T-shape, the first and second lateral protrusions filling the pair of undercut regions;
    forming a drain region in the substrate comprising a first lightly-doped drain region under the first lateral protrusion, a second lightly-doped drain region that is deeper than the first lightly-doped drain region adjacent the first lightly-doped drain region, and a heavily-doped drain region adjacent to the second lightly-doped drain region; and
    forming a source region in the substrate comprising a first lightly-doped source region under the second lateral protrusion, a second lightly-doped source region that is deeper than the first lightly-doped source region adjacent the first lightly-doped source region, and a heavily-doped source region adjacent to the second lightly-doped source region.

2. The method of claim 1, wherein the bottom of the groove exposes a portion of the active region and further comprising forming a gate dielectric layer on the exposed portion of the active region.

3. The method of claim 2, wherein forming the gate pattern comprises:
    forming an undoped semiconductor layer on the substrate provided with the gate dielectric layer thereon to fill the groove; and
    planarizing the undoped semiconductor layer until the surface of the second layer is exposed to form the undoped gate pattern in the groove.

4. The method of claim 3 wherein the undoped semiconductor layer comprises an undoped silicon layer.

5. The method of claim 2 wherein forming the groove that penetrates the second layer and the first layer comprises:
    forming a capping layer on the second layer;
    patterning the capping layer to form a trench region that exposes a portion of the second layer;
    forming a trench spacer on the sidewalls of the trench region;
    etching the second layer using the capping layer and the trench spacer as an etch mask so as to expose a portion of the first layer; and
    etching the exposed portion of the first layer in an isotropic manner so as to form the pair of undercut regions.

6. The method of claim 5, wherein forming the gate pattern comprises:
    forming an undoped semiconductor layer on the substrate provided with the gate dielectric layer thereon to fill the groove; and
    planarizing the undoped semiconductor layer, the capping layer, and the trench spacer until an upper part of the second layer is exposed to form the gate pattern in the groove.

7. The method of claim 2, wherein forming the groove that penetrates the second layer and the first layer comprises:
    forming a capping layer on the second layer;
    etching the capping layer and the second layer to form a trench region in the capping layer and in a portion of the second layer;
    forming a spacer dielectric layer on the semiconductor substrate provided with the trench region therein;
    etching the spacer dielectric layer to form a trench spacer on the sidewalls of the trench region;
    etching the second layer below the trench region to expose a portion of the first layer; and
    etching the exposed first layer in the isotropic manner so as to form the pair of undercut regions in the first layer.

8. The method of claim 7, wherein forming the gate pattern comprises:
    forming an undoped semiconductor layer on the substrate provided with the gate dielectric layer thereon to fill the groove; and
    planarizing the undoped semiconductor layer, the capping layer, and the trench spacer until an upper part of the second layer is exposed to form the gate pattern in the groove.

9. The method of claim 2, further comprising:
    removing the second layer and the first layer; and
    implanting impurity ions into the active region using the gate pattern as an implant mask so as to simultaneously form the first lightly-doped drain region, the first lightly-doped source region, the second lightly-doped drain region and the second lightly-doped source region.

10. The method of claim 9, further comprising:

forming gate spacers on the sidewalls of the inverted T shaped gate pattern; and implanting impurity ions into the active region using the gate pattern and the gate spacers as an implant mask so as to form a heavily-doped drain region in the active region adjacent to one of the outer sidewalls of the gate spacers and a heavily-doped source region in the active region adjacent to the other one of the outer sidewalls of the gate spacers.

11. The method of claim 10, further comprising forming a curing thermal oxide layer on the substrate prior to forming the gate spacers, wherein the curing thermal oxide layer acts as an etch stop layer during the formation of the gate spacers.

12. The method of claim 11, further comprising forming a spacer etch stop layer on the curing thermal oxide layer, wherein the spacer etch stop layer is formed from a dielectric material having etch selectivity with respect to the gate spacers.

13. The method of claim 10, further comprising the steps of:

exposing the upper surface of the gate pattern and the upper surfaces of the heavily-doped drain region and the heavily-doped source region; and forming a metal suicide layer selectively on the exposed gate pattern and the exposed heavily-doped drain region and the exposed heavily-doped source region.

14. The method of claim 10, wherein the first layer is a buffer layer.

15. The method of claim 14, wherein the buffer layer has a thickness of 100 -300 angstroms.

16. The method of claim 14, wherein the buffer layer has a thickness of less than 100 angstroms.

17. The method of claim 14, wherein the buffer layer has a thickness of 300-500 angstroms.

18. The method of claim 14, wherein the buffer layer is formed from silicon oxide and the second layer is formed from silicon nitride.

19. The method of claim 14, wherein the second layer comprises a molding layer and wherein forming the groove comprises patterning the molding layer to expose a portion of the buffer layer and then etching the exposed portion of the buffer layer in an isotropic manner so as to form the pair of undercut regions.

20. The method of claim 19, wherein each of the pair of undercut regions have a vertically profiled outer sidewall.

21. The method of claim 19, wherein each of the pair of undercut regions have an outer sidewall that is sloped at a positive angle.

22. The method of claim 19, wherein each of the pair of undercut regions have an outer sidewall that is sloped at a negative angle.

23. The method of claim 1, further comprising:

selectively implanting n-type impurity ions into the gate pattern; and then annealing the gate pattern; and the removing the second layer and the first layer.

24. The method of claim 23, wherein the n-type impurity ions are phosphorous ions.

25. The method of claim 23, wherein the annealing is carried out by rapid thermal process with a temperature range of 900-1200 degrees Centigrade.

* * * * *